US012009788B2

(12) United States Patent
Mokhti et al.

(10) Patent No.: US 12,009,788 B2
(45) Date of Patent: Jun. 11, 2024

(54) IN-TRANSISTOR LOAD MODULATION

(71) Applicant: MACOM Technology Solutions Holdings, Inc., Lowell, MA (US)

(72) Inventors: Zulhazmi A. Mokhti, Morgan Hill, CA (US); Frank Trang, San Jose, CA (US); Haedong Jang, San Jose, CA (US)

(73) Assignee: MACOM Technology Solutions Holdings, Inc., Lowell, MA (US)

( * ) Notice: Subject to any disclaimer, the term of this patent is extended or adjusted under 35 U.S.C. 154(b) by 269 days.

(21) Appl. No.: 16/367,631

(22) Filed: Mar. 28, 2019

(65) Prior Publication Data

US 2020/0313624 A1    Oct. 1, 2020

(51) Int. Cl.
| H03F 1/02 | (2006.01) |
| H03F 1/56 | (2006.01) |
| H03F 3/193 | (2006.01) |
| H03F 3/24 | (2006.01) |

(52) U.S. Cl.
CPC ......... *H03F 1/0288* (2013.01); *H03F 1/0277* (2013.01); *H03F 1/56* (2013.01); *H03F 3/193* (2013.01); *H03F 3/245* (2013.01)

(58) Field of Classification Search
CPC .......... H03F 1/0288; H03F 1/56; H03F 3/193; H03F 1/0277; H03F 3/245
USPC .............................. 330/277, 124 R, 295, 307
See application file for complete search history.

(56) References Cited

U.S. PATENT DOCUMENTS

| 6,204,731 | B1 | 3/2001 | Jiang et al. |
| 6,700,444 | B2 | 3/2004 | Pengelly |
| 6,737,922 | B2 | 5/2004 | Pengelly et al. |
| 6,791,417 | B2 | 9/2004 | Pengelly et al. |
| 7,193,473 | B2 | 3/2007 | Pengelly et al. |
| 7,330,071 | B1* | 2/2008 | Dening ................. H03F 1/0288 330/124 R |
| 7,619,468 | B1* | 11/2009 | Bowles .................... H03F 3/19 330/124 R |
| 9,407,214 | B2 | 8/2016 | Pribble et al. |

(Continued)

FOREIGN PATENT DOCUMENTS

| EP | 3163746 A1 | 5/2017 |
| JP | 2003282724 A | 10/2003 |

(Continued)

OTHER PUBLICATIONS

Doherty, W.H. "A New High Efficiency Power Amplifier for Modulated Waves" Proceedings of the Institute of Radio Engineers 24(9):1163-1182 (Sep. 1936).

(Continued)

*Primary Examiner* — Andrea Lindgren Baltzell
*Assistant Examiner* — Khiem D Nguyen
(74) *Attorney, Agent, or Firm* — Myers Bigel, P.A.

(57) ABSTRACT

A power amplifier includes a semiconductor die having a main amplifier and a peaking amplifier. The main amplifier includes at least one first transistor, and the peaking amplifier includes at least one second transistor that is different than the first transistor. The peaking amplifier is configured to modulate a load impedance of the main amplifier responsive to a common gate bias applied to respective gates of the first and second transistors. Related fabrication and methods of operation are also discussed.

32 Claims, 10 Drawing Sheets

(56) References Cited

U.S. PATENT DOCUMENTS

| | | | |
|---|---|---|---|
| 9,966,903 B1* | 5/2018 | McLaren | H03F 3/211 |
| 2004/0085132 A1 | 5/2004 | Pengelly et al. | |
| 2007/0298736 A1 | 12/2007 | Fujioka et al. | |
| 2012/0133442 A1* | 5/2012 | Blednov | H01L 23/64 |
| | | | 330/295 |
| 2015/0002227 A1 | 1/2015 | Pribble et al. | |
| 2015/0145601 A1* | 5/2015 | Moronval | H03F 1/07 |
| | | | 330/295 |
| 2016/0241209 A1* | 8/2016 | Lehtola | H03F 1/565 |
| 2017/0271329 A1 | 9/2017 | Farrell et al. | |
| 2018/0211907 A1 | 7/2018 | Bajuri et al. | |
| 2018/0374943 A1 | 12/2018 | Liu et al. | |

FOREIGN PATENT DOCUMENTS

| | | |
|---|---|---|
| JP | 2006525749 A | 11/2006 |
| JP | 2015220680 A | 12/2015 |
| JP | 2016528782 A | 9/2016 |
| JP | 2018125526 A | 8/2018 |
| WO | 2008035396 A1 | 3/2008 |
| WO | 2015114698 A1 | 8/2015 |

OTHER PUBLICATIONS

Gustafsson et al. "A Wideband and Compact GaN MMIC Doherty Amplifier for Microwave Link Applications" IEEE Transactions on Microwave Theory and Techniques 61(2):922-930 (Feb. 2013).

Slade, Bill "The Basics of the Doherty Amplifier" White Paper, Orban Microwave Products (16 Pages) (Aug. 2011).

Notification of Transmittal of the International Search Report and the Written Opinion of the International Searching Authority, or the Declaration, in corresponding PCT Application No. PCT/US2020/023128 (dated Jul. 14, 2020).

Japanese Office Action Corresponding to Japanese Patent Application No. 2021556730 (Foreign Text, 4 Pages, English Translation Thereof, 6 Pages) (dated Jan. 11, 2023).

Japanese Office Action corresponding to Japanese Patent Application No. 2021-556730 (dated Jul. 5, 2023).

* cited by examiner

IN-TRANSISTOR LOAD MODULATION

FIELD

The present disclosure relates to microelectronic devices, and more particularly, to high power field effect transistors.

BACKGROUND

Electrical circuits requiring high power handling capability while operating at high frequencies, such as radio frequencies (500 MHz), S-band (3 GHz) and X-band (10 GHz), have in recent years become more prevalent. Because of the increase in high power, high frequency circuits, there has been a corresponding increase in demand for semiconductor devices which are capable of reliably operating at radio and microwave frequencies while still being capable of handling high power loads.

Radio Frequency (RF) power amplifiers in communication systems may be responsible for generating the high power needed for wireless communications. A power amplifier (PA) may include one or more active transistors and passive matching networks at the input and output nodes. Different RF power applications may have differing requirements for power amplifier, for example, with respect to output power and efficiency. For example, RF PAs used in base stations may need to be efficient not only at peak power, but also at average power, which may be at several decibels (dB) below peak power. However, achieving this goal may be challenging because peak efficiency may be reached near peak power. At back-off or average power, the efficiency tends to drop drastically.

To address efficiency at back-off power, several PA architectural solutions have been proposed, including Doherty implementations. Various Doherty amplifier implementations are described in U.S. Pat. No. 6,700,444 to Pengelly, U.S. Pat. No. 6,737,922 to Pengelly et al., U.S. Pat. No. 6,791,417 to Pengelly et al., U.S. Pat. No. 7,193,473 to Pengelly et al., U.S. Pat. No. 9,407,214 Pribble et al., and "A Wideband and Compact GaN MMIC Doherty Amplifier for Microwave Link Applications" by Gustafsson et al., *IEEE Transactions on Microwave Theory and Techniques*, Vol. 61, No. 2 (February 2013).

SUMMARY

According to some embodiments of the present disclosure, a power amplifier includes a semiconductor die having a main amplifier and a peaking amplifier. The main amplifier includes at least one first transistor, and the peaking amplifier includes at least one second transistor that is different than the first transistor. The peaking amplifier is configured to modulate a load impedance of the main amplifier responsive to a common gate bias applied to respective gates of the first and second transistors.

In some embodiments, based on the common gate bias, the first and second transistors on the semiconductor die may be configured to turn on in sequence responsive to different power levels of an input signal to the power amplifier.

In some embodiments, the first and second transistors may have first and second threshold voltages, respectively. The first threshold voltage may be different than the second threshold voltage. For example, the first threshold voltage may be less than the second threshold voltage.

In some embodiments, the semiconductor die may further include an input transmission line that electrically connects respective inputs of the main and the peaking amplifiers on the semiconductor die to provide an input signal thereto.

In some embodiments, the semiconductor die may further include an output transmission line that electrically connects respective outputs of the main and the peaking amplifiers on the semiconductor die.

In some embodiments, at least one of the input transmission line or the output transmission line comprises an electrical length that is configured to provide signals to the respective inputs or signals from the respective outputs with a predetermined phase shift therebetween based on a frequency component of the input signal.

In some embodiments, the respective gates of the first and second transistors may include respective elongated gate fingers. The input transmission line may be a gate runner that electrically connects the respective elongated gate fingers of the first and second transistors to provide the common gate bias thereto.

In some embodiments, the first and second transistors may further include respective elongated drain contacts extending between pairs of the respective elongated gate fingers. The output transmission line may be a drain runner that electrically connects the respective elongated drain contacts of the first and second transistors.

In some embodiments, the electrical length of the input transmission line may be defined by a portion of the gate runner that extends between the respective elongated gate fingers of the first and second transistors.

In some embodiments, the electrical length of the output transmission line may be defined by a portion of the drain runner that extends between the respective elongated drain contacts of the first and second transistors.

In some embodiments, the portion of the gate runner and/or or the portion of the drain runner may be free of electrical connections to the first and second transistors.

In some embodiments, the respective elongated gate fingers of the first and second transistors may be connected to the gate runner by first and second gate buses at opposite ends of the portion of the gate runner, respectively.

In some embodiments, the respective elongated drain contacts of the first and second transistors may be connected to the drain runner by first and second drain buses at opposite ends of the portion of the drain runner, respectively.

In some embodiments, the respective elongated gate fingers of the first transistors may include different materials, different dopant concentrations, different thicknesses, and/or different depths relative to respective channel regions thereof than the respective elongated gate fingers of the second transistors on the semiconductor die.

In some embodiments, the electrical length may be one quarter of a wavelength corresponding to a frequency component of the input signal.

In some embodiments, at least one of the input transmission line or the output transmission line may include a distributed element circuit on the semiconductor die.

In some embodiments, at least one of the input transmission line or the output transmission line may be free of lumped elements.

In some embodiments, the semiconductor die may further include a third amplifier including a third transistor having a third threshold voltage that is different from the first and second threshold voltages.

In some embodiments, the third amplifier may be a driver amplifier having an input configured to receive the input signal to the power amplifier and an output coupled to one or more of the respective gates of the first or second transistors.

In some embodiments, the first transistor may be among a plurality of the first transistors of the main amplifier, and the second transistor may be among a plurality of the second transistors of the peaking amplifier. The plurality of the second transistors may be greater in number than the plurality of the first transistors.

In some embodiments, the first and second transistors may be high electron mobility transistors (HEMTs) or metal-oxide-semiconductor field effect transistors (MOSFETs).

According to some embodiments of the present disclosure, a method of fabricating a power amplifier includes forming a semiconductor die comprising a main amplifier including a first transistor, and a peaking amplifier including a second transistor that is different than the first transistor. The peaking amplifier is configured to modulate a load impedance of the main amplifier responsive to a common gate bias applied to respective gates of the first and second transistors.

In some embodiments, based on the common gate bias, the first and second transistors on the semiconductor die may be configured to turn on in sequence responsive to different power levels of an input signal to the power amplifier.

In some embodiments, forming the semiconductor die may include forming the first and second transistors to have different first and second threshold voltages, respectively.

In some embodiments, forming the semiconductor die may include forming an input transmission line that electrically connects respective inputs of the main and the peaking amplifiers on the semiconductor die to provide an input signal thereto.

In some embodiments, forming the semiconductor die may include forming an output transmission line that electrically connects respective outputs of the main and the peaking amplifiers on the semiconductor die.

In some embodiments, forming the semiconductor die may include forming at least one of the input transmission line or the output transmission line to have an electrical length that is configured to provide signals to the respective inputs or signals from the respective outputs with a predetermined phase shift therebetween based on a frequency component of the input signal.

In some embodiments, forming the semiconductor die may include forming the respective gates of the first and second transistors to include respective elongated gate fingers. The input transmission line may be a gate runner that electrically connects the respective elongated gate fingers of the first and second transistors to provide the common gate bias thereto.

In some embodiments, forming the semiconductor die may include forming the first and second transistors to further include respective elongated drain contacts extending between pairs of the respective elongated gate fingers. The output transmission line may be a drain runner that electrically connects the respective elongated drain contacts of the first and second transistors.

In some embodiments, forming the semiconductor die may include forming the respective gates of the first transistors with different materials, different dopant concentrations, different thicknesses, and/or different depths relative to respective channel regions thereof than the respective gates of the second transistors on the semiconductor die.

In some embodiments, forming the semiconductor die may include singulating the semiconductor die including the main amplifier and the peaking amplifier thereon from a semiconductor wafer.

According to some embodiments of the present disclosure, a semiconductor device, includes a semiconductor die; a first amplifier on the semiconductor die, the first amplifier comprising a plurality of first transistors having a first threshold voltage and comprising first gate fingers; a second amplifier on the semiconductor die, the second amplifier comprising a plurality of second transistors having a second threshold voltage different than the first threshold voltage and comprising second gate fingers; and a gate runner on the semiconductor die, the gate runner electrically connecting the first gate fingers and the second gate fingers to apply a common gate bias to the first and second amplifiers. A portion of the gate runner extending between the first gate fingers and the second gate fingers has an electrical length that is based on a frequency component of a radio frequency (RF) input signal to the first and second amplifiers.

In some embodiments, based on the common gate bias, the first and second amplifiers may be configured to turn on in sequence responsive to different power levels of the RF input signal.

In some embodiments, the semiconductor device may further include a drain runner on the semiconductor die, the drain runner electrically connecting first drain fingers of the first transistors and second drain fingers of the second transistors. A portion of the drain runner extending between the first drain fingers and the second drain fingers may have the electrical length.

In some embodiments, the portion of the gate runner and/or or the portion of the drain runner may be free of electrical connections to the first and second transistors.

In some embodiments, the first and second gate fingers may be connected to the gate runner by first and second gate buses at opposite ends of the portion of the gate runner, respectively.

In some embodiments, the first and second drain fingers may be connected to the drain runner by first and second drain buses at opposite ends of the portion of the drain runner, respectively.

In some embodiments, the electrical length may be one quarter of a wavelength corresponding to the frequency component of the RF input signal.

According to some embodiments of the present disclosure, a method of operating a load modulation amplifier includes providing a common bias to a main amplifier and a peaking amplifier on a semiconductor die. The peaking amplifier is configured to modulate a load impedance of the main amplifier responsive to the common bias.

BRIEF DESCRIPTION OF THE DRAWINGS

The accompanying drawings, which are included to provide a further understanding of the invention and are incorporated in and constitute a part of this application, illustrate certain embodiment(s) of the invention. In the drawings.

DETAILED DESCRIPTION OF EMBODIMENTS

Some embodiments described herein are directed to power amplifier configurations that can maintain efficiency when operating at back-off or average power, such as Doherty configurations, which include high power transistor structures that are fabricated and electrically connected on a common semiconductor structure (e.g., a same semiconductor die that has been diced or singulated from a larger wafer). In particular, embodiments described herein may include RF transistor structures that implement a first amplifier and a second amplifier that is configured to modulate a load impedance of the first amplifier responsive to a single or common gate bias (also referred to herein as a common bias) on a same semiconductor die.

Some power amplifier configurations described herein may be implemented using a plurality of "unit cell" transistors that are fabricated on a common semiconductor die. Each unit cell transistor may include a source region, a drain region and a channel region in a semiconductor material, with the channel region being between the source and drain regions. A gate electrode or terminal (or "gate"), which may be implemented as an elongated gate finger, is formed above the channel region and extends in parallel between source and drain contacts, as is schematically illustrated in FIG. 1.

Figure 1:
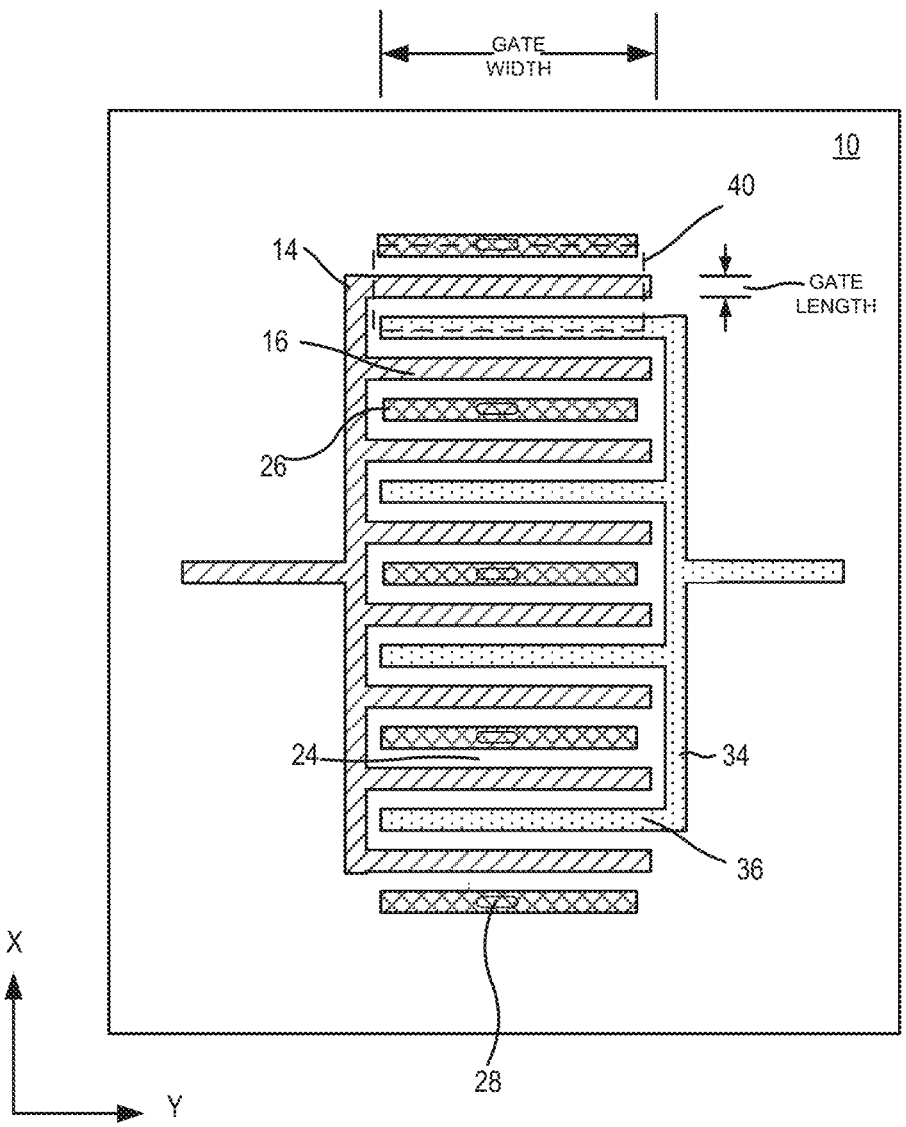
FIG. 1 is a plan view of a conventional multi-cell transistor device.

As shown in FIG. 1, a unit cell transistor of semiconductor device 10 is illustrated at box 40, and includes electrically conductive gate fingers 16 that extend between adjacent source and drain fingers 26 and 36. The gate fingers 16 are spaced apart from each other along a first direction (e.g., the x-direction in FIG. 1) and extend (e.g., in parallel) in a second direction (e.g., the y-direction in FIG. 1). The gate fingers 16 are electrically connected to each other through a gate bus 14. Electrically conductive source contacts or fingers 26 are spaced apart from each other along the first direction and extend in the second direction. The source fingers 26 may be electrically connected to each other through vias or other structures (not visible in FIG. 1). In some embodiments, the source fingers 26 may be electrically connected to a source contact on the bottom side of the die 10 (not visible in FIG. 1). Electrically conductive drain contacts or fingers 36 are likewise spaced apart from each other along the first direction and extend in the second direction, and are electrically connected to each other through a drain bus 34. The gate, source, and drain fingers 16, 26, 36 may each comprise a respective conductive material, such as a metal or a metal alloy. Each gate finger 16 extends along the y-direction between a pair of adjacent source and drain fingers 26, 36. The "gate length" refers to the distance of the gate metallization in the x-direction (between source and drain fingers 26 and 36), while the "gate width" is the distance by which the gate fingers 16 and the source and drain contacts 26 and 36 overlap in the y-direction. That is, "width" of a gate finger 16 refers to the dimension of the gate finger 16 that extends in parallel to the adjacent source/drain contacts 26, 36 (the distance along the y-direction). The power handling capability of the semiconductor device 10 may be proportional to its "gate periphery." The gate periphery of semiconductor device 10 may refer the sum of the gate widths for each gate finger 16 for each unit cell transistor 40 thereof.

Figure 2A:
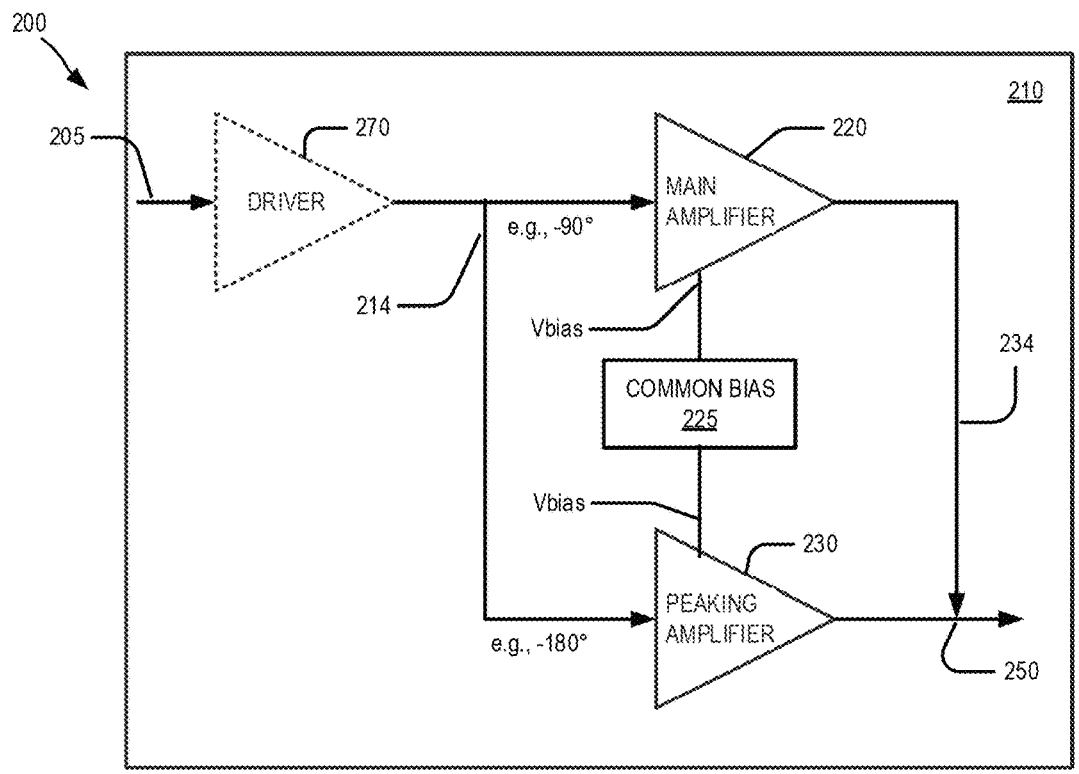
FIG. 2A is a circuit diagram of a PA in accordance with some embodiments of the present disclosure.
Figure 2B:
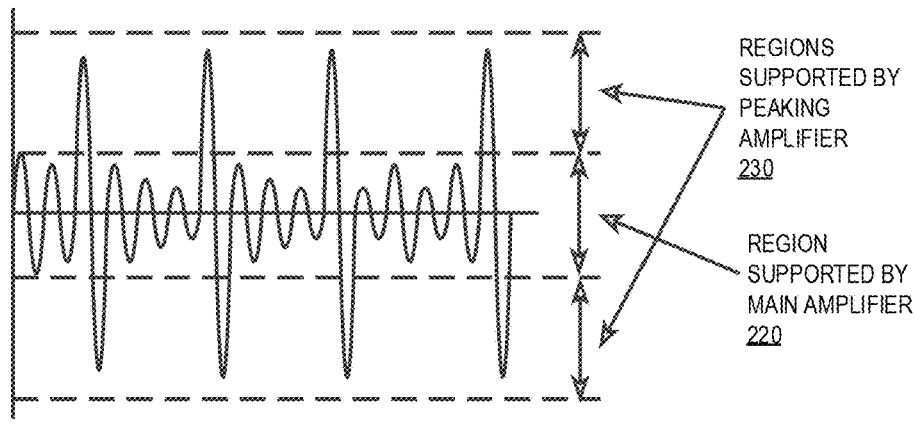
FIGS. 2B and 2C illustrate circuit operation of the PA of FIG. 2A.
Figure 2C:
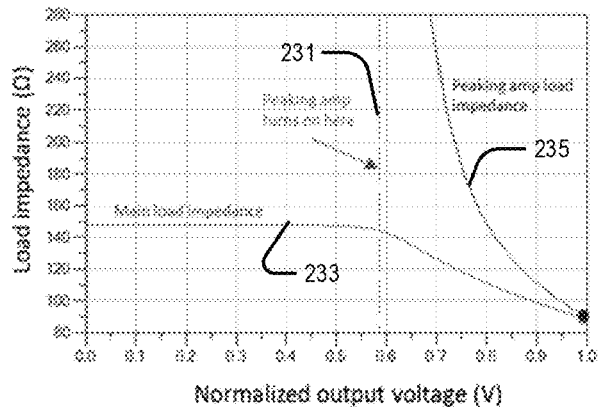

FIG. 2A is circuit diagram and FIGS. 2B and 2C illustrate circuit operation of a PA 200 in a Doherty configuration that can be implemented by on-die transistor structures in response to a common gate bias Vbias in accordance with some embodiments of the present disclosure. As shown in FIG. 2A, the PA 200 includes at least two devices, illustrated as a carrier (or "main") amplifier 220 and at least one peaking amplifier 230 that are electrically connected in parallel on a same semiconductor die 210. The main amplifier 220 may be biased to operate in Class B or Class AB mode, while the peaking amplifier 230 may be biased to operate in Class C mode by a common bias 225. A power splitter or divider circuit 214 is configured to receive an input power signal (e.g., an RF or other AC input signal) and output respective signals to inputs of the main amplifier 220 and the peaking amplifier 230. In some embodiments, the power splitter 214 may be implemented as an input transmission line that couples the inputs of the main amplifier 220 and the peaking amplifier 230. An impedance inverter circuit 234 couples an output of the main amplifier 220 to an output of the peaking amplifier 230, for example, at an output combining node 250. In some embodiments, impedance inverter circuit 234 and the combining node 250 may be implemented as an output transmission line that couples the outputs of the main amplifier 220 and the peaking amplifier 230

The power splitter 214 may be configured to introduce a phase shift or phase delay between the respective signals provided to the inputs of the main amplifier 220 and the peaking amplifier 230, to provide phase matching such that the output signals provided at the respective outputs of the main amplifier 220 and the peaking amplifier 230 are in-phase. For example, the power splitter 214 may have an electrical length (also referred to as phase length) that is configured to provide a predetermined phase shift (e.g., based on a wavelength corresponding to a frequency component of the input signal) to a signal input to the peaking amplifier 230, to compensate for a similar phase shift introduced by the electrical length of the impedance inverter 234 to a signal at the output of the main amplifier 220. For instance, in response to an RF input signal at input node 205, the power splitter 214 may generate two outputs that are 90 degrees out-of-phase with one another as inputs to the main amplifier 220 and the peaking amplifier 230, respectively. The 90 degree phase split may be used such that the output of the peaking amplifier 230 is in phase with the output of the main amplifier 220 after a 90 degree phase shift is introduced by the impedance inverter 234 (corresponding to one quarter wavelength with respect to the operating frequency of the PA 200). The output of the main amplifier 220, after passing through the impedance inverter 234, is combined with the output of the peaking amplifier 230 at the combining node 250.

In some embodiments, a load matching circuit may be coupled to the output combining node 250 and configured to provide an RF output signal to a load. In some embodiments, the amplifier may further include one or more input drivers 270 (illustrated as being configured to receive an input power signal and having an output coupled to the input of the power divider 214), to implement a multi-stage amplifier. Additionally or alternatively, respective input drivers 270 may be coupled to the inputs of the main amplifier 220 and the peaking amplifier 230. The input driver(s) 270 may be, for example, Class A or B amplifier(s), and may be used to increase overall gain.

Embodiments described herein may include a main amplifier 220 and a peaking amplifier 230 that is configured to modulate a load impedance of the main amplifier 220 responsive to a common bias 225 (e.g., the same DC bias current or voltage signal, which may be provided via a common biasing node or circuit). As shown in FIGS. 2A to 2C, the main amplifier 220 is configured to operate (i.e., turn on) earlier than the peaking amplifier 230 in response to an input power signal (e.g., an RF input signal) at input node 205, with the peaking amplifier 230 in an off state. As the main amplifier 220 reaches peak or maximum efficiency near its compression (the input power level where the gain of an amplifier has been reduced from its peak gain by a certain amount; e.g., 1 dB), the peaking amplifier 230 is configured to turn on. The power splitter 214 may determine a ratio of the input signal between the main amplifier 220 and peaking amplifier 230. In some embodiments, the power splitter 214 may also act as a common biasing node or circuit for the main and peaking amplifiers 220 and 230, to which the common bias signal is applied. The peaking amplifier 230 may provide additional total output power and reaches its peak efficiency a few dB of output power later, while modulating the load seen by the main amplifier 220. In particular, as shown in FIG. 2C, the load impedance 233 of the main amplifier 220 is varied in response to operation 231 of the peaking amplifier 230 and the impedance of the impedance inverter 234. The load impedance 235 of the peaking amplifier 230 is modulated as well. This can provide an efficient overall PA 200 at the total peak power as well as at several dB below peak power (e.g., 6 dB for equal size devices/symmetric configurations).

Operation of the PA 200 shown in FIG. 2A is thus achieved by dynamic load modulation of the first device 220 beginning from the point where the first device 220 reaches its peak efficiency, as shown in FIGS. 2B and 2C. By operation of the second device 230 at or near the point of peak efficiency of the first device 220, the load impedance 233 seen by the first device 220 starts to decrease, which causes the first device 220 to come out of compression and produce a few dB more power (e.g., 3 dB for equal size devices/symmetric configurations). The impedance inverter 234 may increase the load impedance presented to the first device 220 as the second device 230 is backed-off, providing a circuit arrangement whereby operation of the second device 230 is configured to modulate the load of the first device 220.

Figure 11:
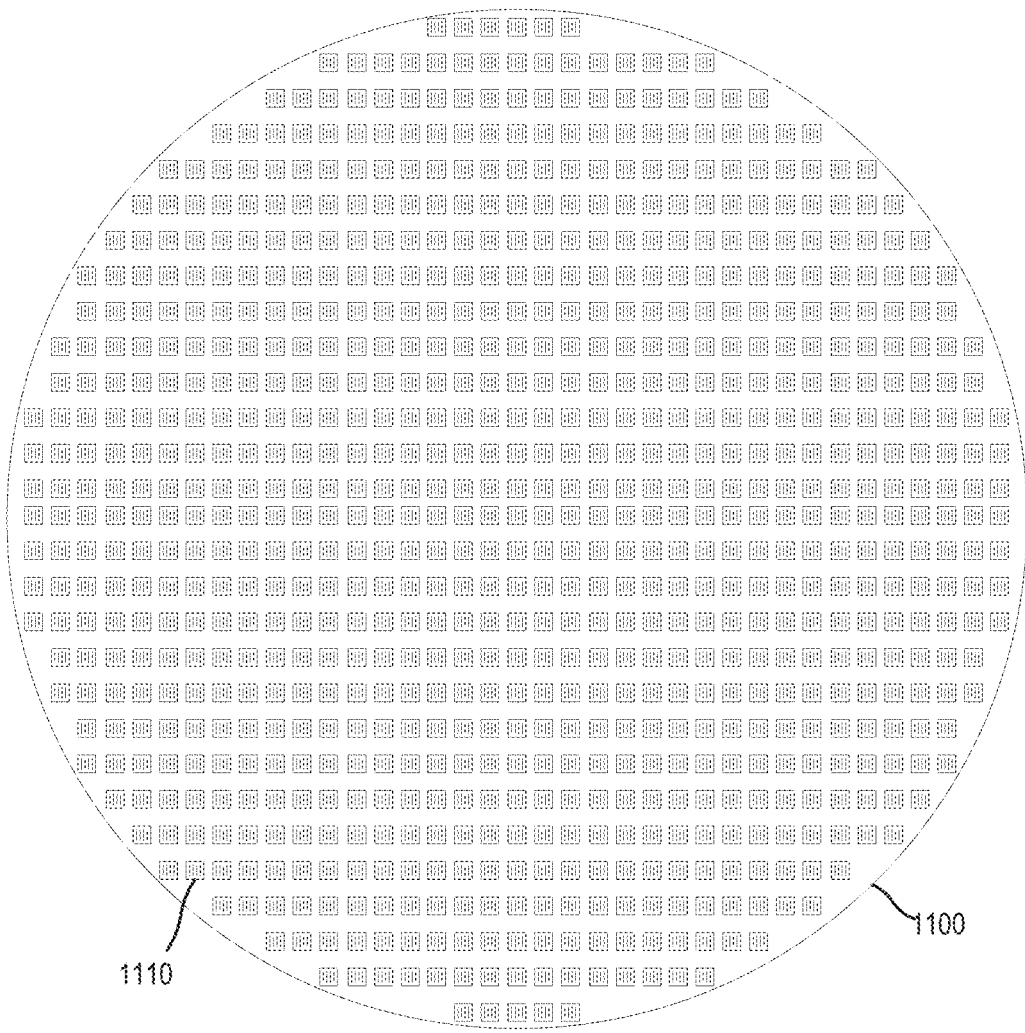
FIG. 11 is a plan view illustrating a semiconductor wafer that may be singulated to provide respective semiconductor dies each including single-bias load modulation amplifier circuits in accordance with some embodiments of the present disclosure.

The configuration of the PA 200 shown in FIG. 2A may be implemented in a same semiconductor die 210 in accordance with some embodiments described herein by one or more of (i) providing a common bias 225 that biases the first and second devices 220 and 230 such that one (device 230) turns on later than the other (device 220), (ii) providing a power splitter 214 on the die 210 that splits the input power (e.g., equally for equal size devices) but phases the input power to each device 220, 230 by a predetermined phase shift (e.g., 90° from each other), and (iii) providing an impedance inverter (e.g., a quarter-wavelength line) between the outputs of the devices 220, 230 to provide the predetermined phase shift. That is, embodiments described herein may fabricate the first and second devices 220 and 230, the power splitter 214, the impedance inverter 234, the combiner 250, and the connections therebetween to define respective load modulation amplifiers using semiconductor fabrication processes at the wafer level (e.g., at respective portions 1110 of a same semiconductor wafer 1100 as shown in FIG. 11, which may be diced to provide respective semiconductor dies 1110 that each are configured to provide the power splitting, power combining, and load modulation). Therefore, a single gate bias may be applied to the respective transistors that define the first and second devices 220 and 230, with power splitting and combining likewise implemented on the same die 210, providing a PA 200 in a Doherty configuration that is free of external (e.g., off-die 210) splitter and/or combiner circuits.

Figure 3:
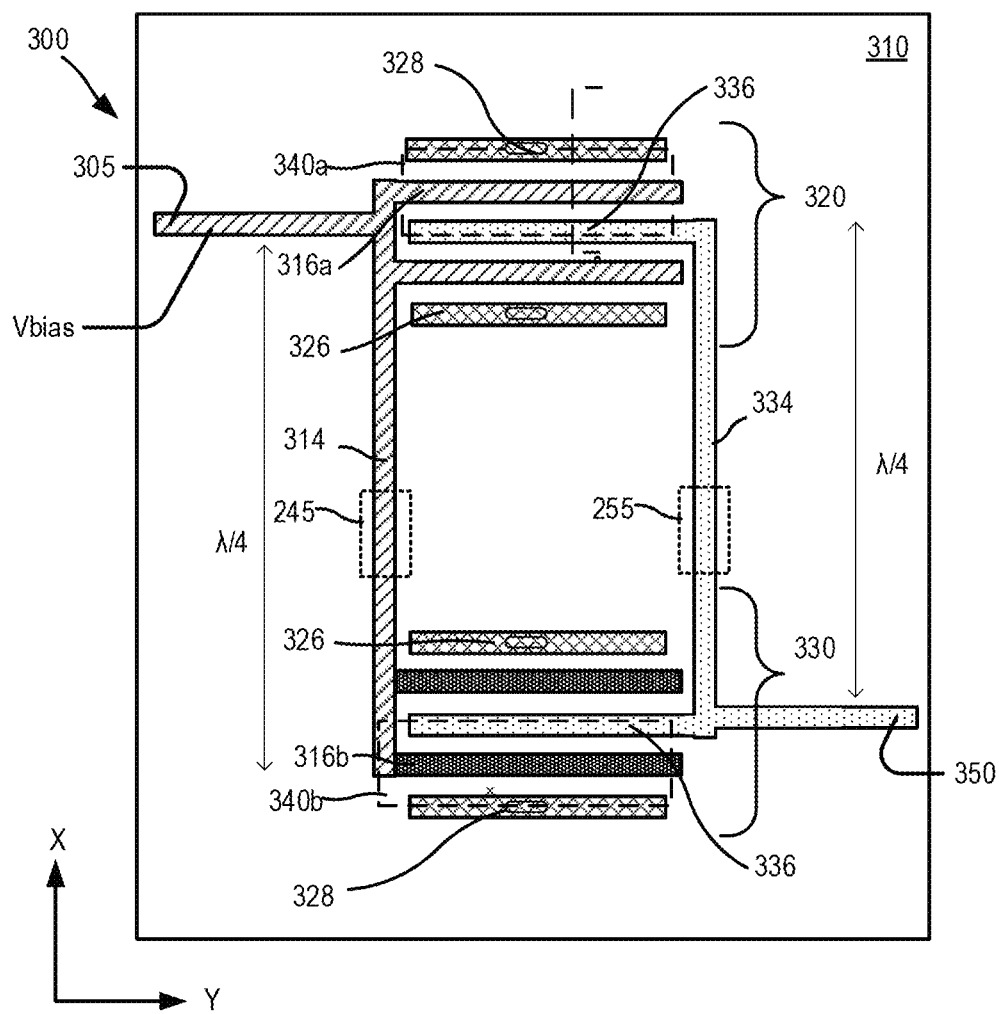
FIG. 3 illustrates a PA on a same semiconductor die in accordance with some embodiments of the present disclosure.

Some embodiments described herein may implement a load modulation mechanism 200 in one transistor die 210 as shown in FIG. 2A by fabricating transistors having different characteristics on the same die, such that one (device 230) turns on sequentially after the other (device 220) based on a common bias 225. FIG. 3 illustrates a PA 300 in a Doherty configuration including a main amplifier 320 and a peaking amplifier 330 implemented using unit cell transistors 340a, 340b (collectively "340") having different operating, structural, and/or material characteristics on a same semiconductor die 310 in accordance with some embodiments described herein. The PA 300 of FIG. 3 may operate in a manner similar as described above with reference to the diagrams of FIGS. 2A and 2B.

As shown in FIG. 3, the unit cell transistors 340a, 340b include respective electrically conductive gate fingers 316a, 316b (collectively "316") that extend between adjacent source and drain fingers 326 and 336. The gate fingers 316 are spaced apart from each other along a first direction (e.g., the x-direction in FIG. 3) and extend (e.g., in parallel) in a second direction (e.g., the y-direction in FIG. 3). The gate fingers 316 are electrically connected to each other through a gate runner 314 or input transmission line. Electrically conductive source contacts or fingers 326 are spaced apart from each other along the first direction and extend in the second direction. The source fingers 326 may be electrically connected to each other or other structures (not visible in FIG. 3). In some embodiments, the source fingers 326 may be electrically connected to a source contact on the bottom side of the semiconductor die 310 (not visible in FIG. 3) by vias 328. Electrically conductive drain contacts or fingers 336 are likewise spaced apart from each other along the first direction and extend in the second direction, and are electrically connected to each other through a drain runner 334 or output transmission line.

Some embodiments may implement load modulation as described herein by fabricating transistors 340a, 340b with two or more distinct threshold voltages in one transistor die 310. As further shown in FIG. 3, the gate fingers 316 may include first gate fingers 316a and second gate fingers 316b. The gate fingers 316a in a first region of the semiconductor die 310 define a main amplifier 320, and the gate fingers 316b in a second region of the semiconductor die 310 define a peaking amplifier 330. The gate runner 314 electrically connects the respective gates 316a, 316b of the main amplifier 320 and the peaking amplifier 330, and may define an input node 305 for the PA 300. The drain runner 314 electrically connects the respective drain fingers 336 of the main amplifier 320 and the peaking amplifier 330, and may define an output node 350 for the PA 300. The unit cell transistors 340a of the main amplifier 320 (i.e., the unit cell transistors that include the gate fingers 316a) may each have a first threshold voltage value $V_{TH-1}$, e.g., along the width of each gate finger 316a. The unit cell transistors 340b of the peaking amplifier 330 (i.e., the unit cell transistors that include the gate fingers 316b) may each have a second threshold voltage value $V_{TH-2}$, e.g., along the width of each gate finger 316b. The second threshold voltage value $V_{TH-2}$ may be greater than the first threshold voltage value $V_{TH-1}$.

The unit cell transistors 340a and 340b in the first and second regions of the die 310 may be fabricated so as to have two or more different threshold voltage values in a variety of ways, including the use of different materials, shapes, and/or doping concentrations to form the different gate fingers 316a and 316b, and/or altering the composition, doping concentration and/or thickness of one or more layers that underlie the gate fingers 316a versus 316b (e.g., by forming the gate fingers 316a and 316b in respective gate recesses of different depths relative to an underlying channel region). Some fabrication processes for defining transistors with different threshold voltages are described, for example, in U.S. patent application Ser. No. 15/628,932 to Liu et. al, the disclosure of which is incorporated by reference herein. For ease of description, the gate fingers 316a of the unit cell transistors 340a having the first threshold voltage value $V_{TH-1}$ (that is, the transistors 340a defining the main amplifier 320 and having the lower threshold voltage) are shown using a first form of cross-hatching in FIG. 3, while the gate fingers 316b of the unit cell transistors 340b having the second threshold voltage value $V_{TH-2}$ (that is, the transistors 340b defining the peaking amplifier 330 and having the higher threshold voltage) are shown using a second form of cross-hatching. This same convention is also used in the figures depicting additional embodiments described herein. It will be appreciated, however, that depending upon the fabrication technique used to provide different threshold voltage values, the gate fingers (e.g., gate fingers 316a and 316b) may or may not have the same composition.

As such, one part of the die 310 including the transistors 340b having the second threshold voltage $V_{TH-2}$ may be operated to turn on later (at or responsive to a higher power level of an input signal applied to the input node 305) than another part of the die 310 including the transistors 340a having the first threshold voltage $V_{TH-1}$, emulating the effect of having two different gate biases responsive to a single gate bias Vbias (e.g., the same DC bias voltage signal applied via a common biasing node or circuit 314) such that operation of the transistors 340b of the second amplifier 330 modulates a load impedance at the output of the transistors 340a of the first amplifier 320. In some embodiments, a difference between the first and second threshold voltages ($V_{TH-2}-V_{TH-1}$) may be at least 0.1 volts. In other embodiments, $V_{TH-2}-V_{TH-1}$ may be at least 0.25 volts. In still other embodiments, $V_{TH-2}-V_{TH-1}$ may be at least 0.5 volts. In still other embodiments, $V_{TH-2}-V_{TH-1}$ may be at least 0.05 volts or be between 0.1-1.25 volts. The unit cell transistors that are used to implement the same device (e.g., the main amplifier 320 or the peaking amplifier 330) may each have substantially the same threshold voltage. For example, the unit cell transistors 340a of the main amplifier 320 may have threshold voltages that are within 0.025 volts of each other in some embodiments (and likewise, the unit cell transistors 340b of the peaking amplifier 330). In other embodiments, the unit cell transistors that are used to implement the same device may have threshold voltages that are within 0.01 volts of each other.

Load modulation in response to a single gate bias may not be possible in some conventional transistor amplifiers, due to different gate bias requirement between the main and the peak amplifiers. In such conventional transistor amplifiers, each transistor may be biased independently at the gate, and independently matched at the input and output, and power splitting and combining may be implemented outside the transistor die or package.

In contrast, the power splitter and impedance inverter aspects of the Doherty PA 300 in accordance with some embodiments described herein are implemented on the same semiconductor die 310 by the gate runner 314 and the drain runner 334, respectively. In particular, the gate runner 314 may have an electrical length that is configured to provide a predetermined phase shift (e.g., based on or as a function of a wavelength λ corresponding to a frequency component of the input signal) to a signal input to the peaking amplifier 330, to compensate for a similar phase shift introduced by the electrical length of the drain runner 334 at the output of the main amplifier 320. By way of example only, the gate runner 314 and/or the drain runner 334 may be implemented by respective quarter-wave transmission lines on the die 310, that is, having respective electrical lengths corresponding to one quarter of a wavelength λ, or λ/4, with respect to the operating frequency of the PA 300. As shown in FIG. 3, respective portions of the gate runner 314 and the drain runner 334 defining the desired electrical length/phase shift may extend between the transistors 340a of the main amplifier 320 and the transistors 340b of the peaking amplifier, but may be free of electrical connections (e.g., to gate fingers 316 and/or drain fingers 336 of other amplifiers or transistors).

Load modulation takes place due to the current combining at summing/output node 350 and the impedance inverter provided by the drain runner 334. At the output power combining node 350, the respective currents from the main amplifier 320 and the peaking amplifier 330 are combined when the peaking amplifier 330 starts to contribute power, such that the effective load impedance seen from the main amplifier 320 is increased. The effective load impedance seen from the main amplifier 320 may be defined by the voltage at the power combining node 350 divided by the current from the main amplifier 320 (also referred to herein as the main current). The voltage at the power combining node 350 is established by the respective currents (from the main amplifier 320 and the peaking amplifier 330) into the load, of which the main current represents a portion. The load impedance seen from the main amplifier 320 is effectively increased as the peaking amplifier 330 starts to conduct, and the increased load impedance is inverted by the impedance inverter 334, which reduces the main amplifier load, providing active load modulation. With the reduced main amplifier load, the main current is increased, resulting in increased output power with the modulated load.

Accordingly, in embodiments described herein, when the peaking amplifier 330 including the transistors 340b having the second threshold voltage $V_{TH-2}$ are operated to turn on with some delay (relative to operation of the main amplifier 320 including the transistors 340a having the first threshold voltage $V_{TH-1}$), the current from the peaking amplifier 330 effectively increases the load impedance seen by the main amplifier 320, which is inverted by the impedance inverter 334, resulting in modulation of the load impedance of the main amplifier 320.

Figure 10A:
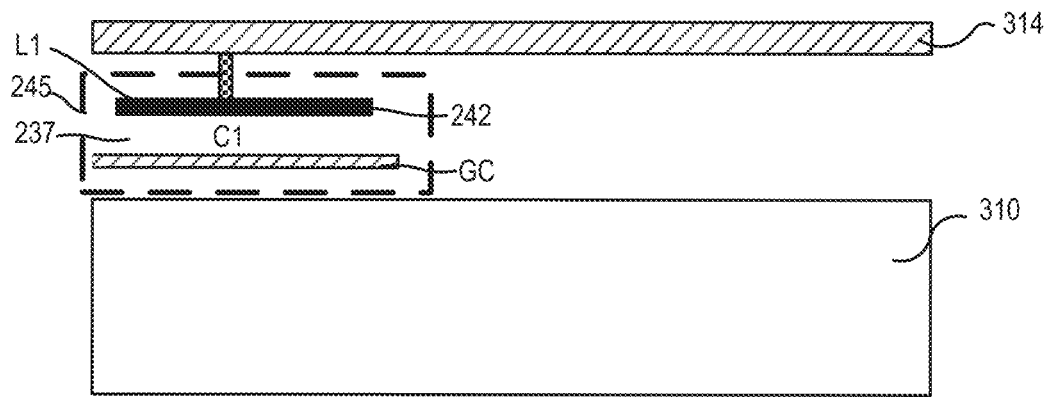
FIGS. 10A and 10B are cross sectional views illustrating distributed element circuits that can be used in input and/or output transmission lines in accordance with some embodiments of the present disclosure.
Figure 10B:
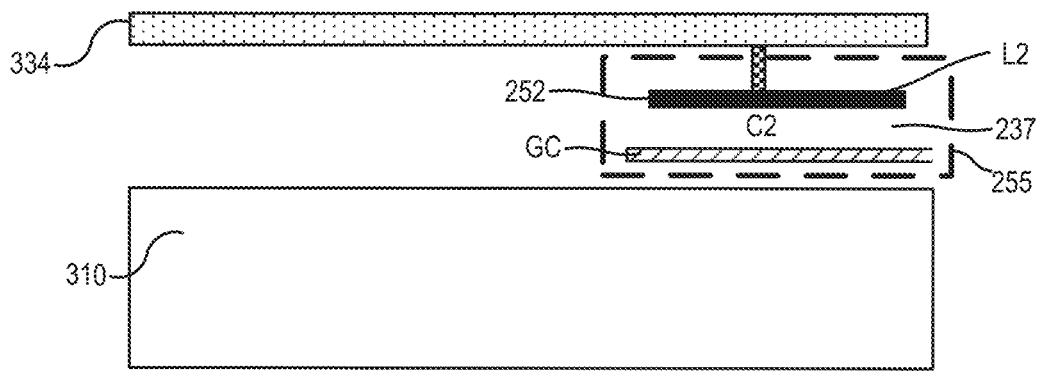

In some embodiments, at least a portion of the gate runner and/or drain runner elements described herein may be implemented by one or more distributed elements that are configured to provide the respective phase shift(s) and/or harmonic rejection. For example, the gate runner 314 and/or the drain runner 314 may be implemented as a combination of inductors and capacitors implemented by metal and/or wiring layers on one or more layers of the die 310 (e.g., above or below the gate fingers 316 or drain fingers 336), which may be connected to the respective gate fingers 316 and/or drain fingers 336 by a plurality of conductive vias, as described for example in U.S. patent application Ser. No. 16/165,846 to Trang et. al, the disclosure of which is incorporated by reference herein. As shown by way of example in the cross-sectional views of FIGS. 10A and 10B, a distributed element circuit 245 or 255 may include a capacitance C1 or C2, respectively, formed between a wiring layer 242 and a ground conductor GC separated by one or more dielectric layers 237. The capacitance C1 or C2 may be coupled to the gate runner 314 or drain runner 334, respectively, on a different layer on the die 310, by respective conductive vias. Additionally or alternatively, the wiring layer 242 may be further formed to provide an inductive element L1 or L2 that is electrically connected (in series or parallel) to the capacitance C1 or C2 and/or to the gate runner 314 or drain runner 334, respectively, by respective conductive vias. Dielectric layer 237 may include one or more dielectrics or layers having electrical characteristics appropriate for forming a capacitance between the wiring layer 242 and the ground conductor GC, for example, silicon oxide, silicon nitride, silicon oxynitride, a high-dielectric, or a combination thereof, though embodiments described herein are not limited thereto. That is, portions of the runners 314 and/or 334 may be implemented by distributed element circuits 245 and/or 255 to provide the desired phase shift(s). The runners 314 and/or 334 (and in some embodiments, the entirety of the PA 300) may be thus free of lumped elements or passive components in some embodiments. Also, while illustrated as providing electrical connections at respective end portions of the fingers 316 or 336, the runners 314 or 334 may provide electrical connections at other portions the fingers 316 or 336, respectively, such as by extending on layers above or below the fingers 316 or 336 and electrically contacting the fingers 316 or 336 by respective via connections.

Figure 4:
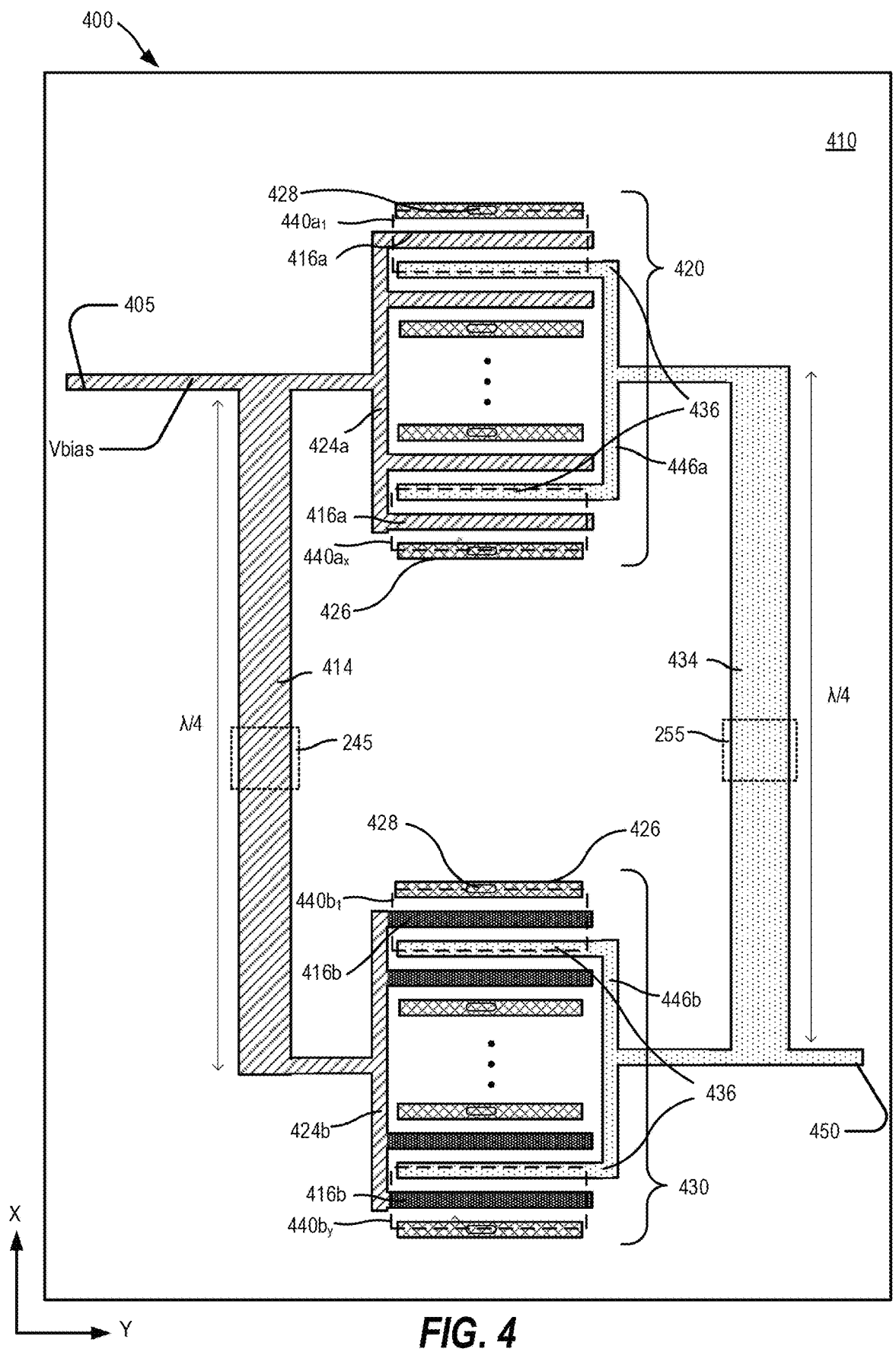
FIG. 4 illustrates a PA on a same semiconductor die in accordance with some embodiments of the present disclosure.

Although illustrated in FIG. 3 with respect to a symmetric Doherty PA arrangement 300 in which the main amplifier 320 and the peaking amplifier 330 include the same number of unit cell transistors 340a and 340b to provide the same power handling capability, it will be understood that embodiments described herein are not limited to such an arrangement. That is, while FIG. 3 may illustrate gate fingers 316a and 316b with two different threshold voltages extending along neighboring drain fingers 336 (such that the main amplifier 320 and peaking amplifier 330 each include two unit cell transistors 340a and 340b, respectively), some embodiments may include asymmetric Doherty or other load modulation amplifier arrangements in which the main amplifier and the peaking amplifier each include a different number of unit cell transistors (e.g., as illustrated in FIG. 4 in the case where x is greater than or less than the value of y). For example, the peaking amplifier 330 may include more unit cell transistors 340 than the main amplifier 320, to provide higher power capability.

FIG. 4 is a illustrates a PA 400 in a Doherty configuration including a main amplifier 420 and a peaking amplifier 430 implemented using unit cell transistors having different operating, structural, and/or material characteristics on a same semiconductor die 410 in accordance with some embodiments described herein. The PA 400 of FIG. 4 is similar to the PA 300 of FIG. 3, but provides first gate fingers 416a (included in unit cell transistors $440a_1 \ldots 440a_x$) having first (e.g., lower) threshold voltages $V_{TH-1}$ in a first group to define the main amplifier 420, and provides second gate fingers 416b (included in unit cell transistors $440b_1 \ldots 440b_y$) having second (e.g., higher) threshold voltages $V_{TH-2}$ in a second group to define the peaking amplifier 430.

As similarly discussed above with reference to FIG. 3, the unit cell transistors $440a_1 \ldots 440a_x$, $440b_1 \ldots 440b_y$ (collectively "440") include respective gate fingers 416a, 416b (collectively "416") that extend between adjacent source and drain fingers 426 and 436. The gate fingers 416 are spaced apart from each other along a first direction (e.g., the x-direction in FIG. 4) and extend (e.g., in parallel) in a second direction (e.g., the y-direction in FIG. 4). The values of x and y indicate the number of unit cell transistors 440 (or gate fingers 416) in the main and peaking amplifiers 420 and 430, respectively. In some embodiments, the values of x and y may be equal, such that the main and peaking amplifiers 420 and 430 each include the same number of gate fingers 416/unit cell transistors 440 in a symmetric configuration. In some embodiments, the values of x and y may be different (e.g., the value of x may be greater than or less than the value of y), such that the main and peaking amplifiers 420 and 430 each include a different number of gate fingers 416/unit cell transistors 440 in an asymmetric configuration.

The gate fingers 416 are electrically connected to each other by a gate runner 414 or input transmission line having a predetermined electrical length (e.g., λ/4). More particularly, the gate fingers 416a of the first group 420 are electrically connected by a gate bus 424a, the gate fingers 416b of the second group 430 are electrically connected by a gate bus 424b, and the gate buses 424a and 424b are electrically connected to the gate runner 414. That is, the gate runner 414 may be configured to split or distribute an input signal provided at an input node 405 to the gate buses 424a and 424b of respective amplifiers 420 and 430 with a phase shift therebetween (to compensate for a similar phase shift introduced by the drain runner 434 at the output of the first group 420). The drain contacts or fingers 436 of each group 420 and 430 are likewise spaced apart from each other along the first direction and extend in the second direction, and are electrically connected to each other by drain buses 446a and 446b, respectively. The drain buses 446a and 446b are electrically connected to a drain runner 434 or output transmission line having a predetermined electrical length (e.g., λ/4), which is used to combine respective output signals from the amplifiers 420 and 430 at an output node 405. As shown in FIG. 4, the respective portions of the gate runner 414 and the drain runner 434 defining the desired electrical length/phase shift may be free of electrical connections (e.g., to gate fingers 416 and drain fingers 436 of other amplifiers or transistors) between the gate buses 424a and 424b between the drain buses 446a and 446b, respectively. Source contacts or fingers 426 are spaced apart from each other along the first direction and extend in the second direction, and may be electrically connected to each other or other structures (e.g., to a source contact on the bottom side of the device 410) by vias 428.

As described herein, it will be understood that large periphery power devices may have non-negligible parasitic components, such as drain-to-source capacitance ($C_{DS}$) and/or gate-to-source capacitance ($C_{GS}$), which may be accounted for by embodiments described herein. For example, in some embodiments, the output impedance inverter 434 (and/or the input delay line 414) may be configured to define the respective electrical lengths (e.g., quarter wavelength) in combination with the parasitic components. That is, the gate runner 414 and/or drain runner 434 may be configured to have an electrical length that is less than/a portion of a quarter wavelength, such that the overall electrical length (including the parasitic components) will define the full quarter wavelength. In further embodiments described herein, the parasitic components may be compensated for; in this case, the impedance inverter 434 and/or the runner 414 may have respective electrical lengths of approximately the full quarter wave length. The compensation may be phase non-inverting compensation, or may be phase inverting compensation (in which case the power combining node 450 may be provided at the top corner of the die 410, e.g., at the output of the main amplifier 420, and the input node 405 may be provided at the bottom corner of the die 410, e.g., at the input of the peaking amplifier 430). In still further embodiments, the (final) line connecting the power combining node 450 to the output (e.g., a load matching circuit coupling the combining node 450 to a load) may be designed or configured to transform the power combining node impedance to the output node impedance when these impedances differ.

The PA 400 of FIG. 4 may function in a manner similar to that described above with reference to the PA 300 of FIG. 3. As such, the gate runner 414 may act as a common biasing node or circuit for the plurality of gates 416 on the die 410, and the transistors $440b_1 \ldots 440b_y$ of the second group 430 having the second threshold voltage $V_{TH-2}$ may be operated to turn on later (responsive to a higher input signal drive level) than the transistors $440a_1 \ldots 440a_x$ of first group 420 having the first threshold voltage $V_{TH-1}$ based on application of the same gate bias Vbias to the common biasing node. The different threshold voltages $V_{TH-1}$ and $V_{TH-2}$ of the different transistor groups 420 and 430 may thus emulate the effect of having two different gate biases responsive to a single gate bias, such that operation of the second transistor group 430 (e.g., in response to an RF input signal at node 405) modulates a load impedance at the output of the first transistor group 420.

Figure 5:
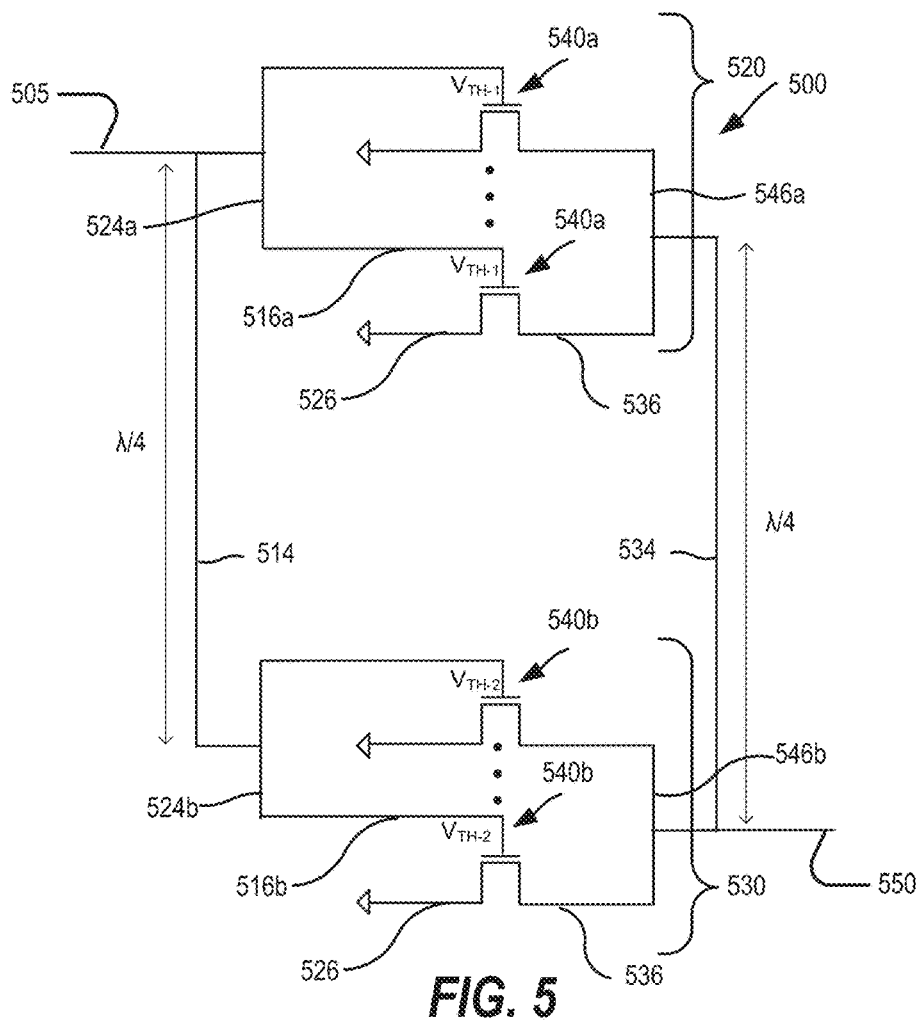
FIG. 5 is an equivalent circuit diagram of the PA shown in FIG. 4.

FIG. 5 is an equivalent circuit diagram illustrating a PA 500 having the configuration of the PA 400 shown in FIG. 4. The PA 500 thus includes first unit cell transistors 540a having first (e.g., lower) threshold voltages $V_{TH-1}$ in a first group to define the main amplifier 520, and unit cell transistors 540b having second (e.g., higher) threshold voltages $V_{TH-2}$ in a second group to define the peaking amplifier 530 in parallel stages on a same semiconductor die. The PA amplifier 500 further includes a gate runner 514 having a predetermined electrical length (e.g., λ/4), which distributes an input signal provided at an input node 505 to the gates 516a and 516b of the transistors 540a and 540b through gate buses 524a and 524b, respectively; and a drain runner 534 having a predetermined electrical length (e.g., λ/4), which combines respective output signals from the drain electrodes 536 of the transistors 540a and 540b at an output node 550, through drain buses 546a and 546b, respectively. The gate runner 514 may act as a common biasing node or circuit for the transistors 540a and 540b having the different threshold voltages $V_{TH-1}$ and $V_{TH-2}$ on the same die, such that operation of the transistors 540b of the peaking amplifier 530 (e.g., in response to an RF input signal at node 505) modulates a load impedance at the output of the transistors 540a of the main amplifier 520 based on a single gate bias.

Figure 6:
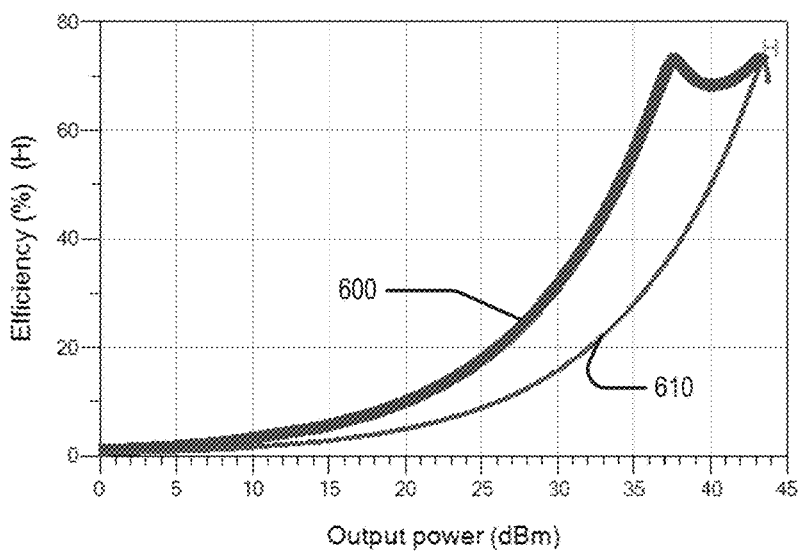
FIG. 6 is a graph illustrating efficiency performance of a conventional class-B or class-AB power amplifier and a PA in accordance with some embodiments of the present disclosure.

FIG. 6 is a graph illustrating efficiency vs. output power (in dBm) of a conventional Doherty PA and a PA in accordance with some embodiments of the present disclosure. In particular, the thinner line 610 shown in FIG. 6 illustrates the efficiency performance of a conventional class-B or class-AB power amplifier. The thicker line 600 in FIG. 6 illustrates the efficiency performance of a single die, single bias Doherty PA that includes transistors having different threshold voltages in accordance with embodiments described herein (such as the PAs 200, 300, 400, 500 described above). FIG. 6 thus illustrates that the single die, single bias Doherty PA in accordance with embodiments described herein has improved efficiency at lower output power levels (e.g., at back-off or average power), while achieving the same or similar efficiency at peak power, as compared with a conventional class-B or class-AB power amplifier.

Some advantages of embodiments described herein allow the use of single gate bias for a load modulation amplifier, by implementing the main and peaking amplifiers using transistors having different threshold voltages on the same semiconductor die. That is, in embodiments described herein, the transistors of the main and peaking amplifiers are fabricated on the same semiconductor die, but do not have independent bias requirements to provide load modulation (i.e., the main and peaking amplifiers are dependent on the same gate bias for operation). In contrast, some conventional implementations of Doherty or load modulation amplifiers may require at least two gate biases, because the transistors on the same semiconductor die may have substantially identical characteristics (e.g., gate and drain finger characteristics) throughout the die, and thus, the transistors of the main and peaking amplifiers may have different gate bias requirements in order to achieve the delayed turn on of the peaking amplifier to modulate the load of the main amplifier.

Figure 7:
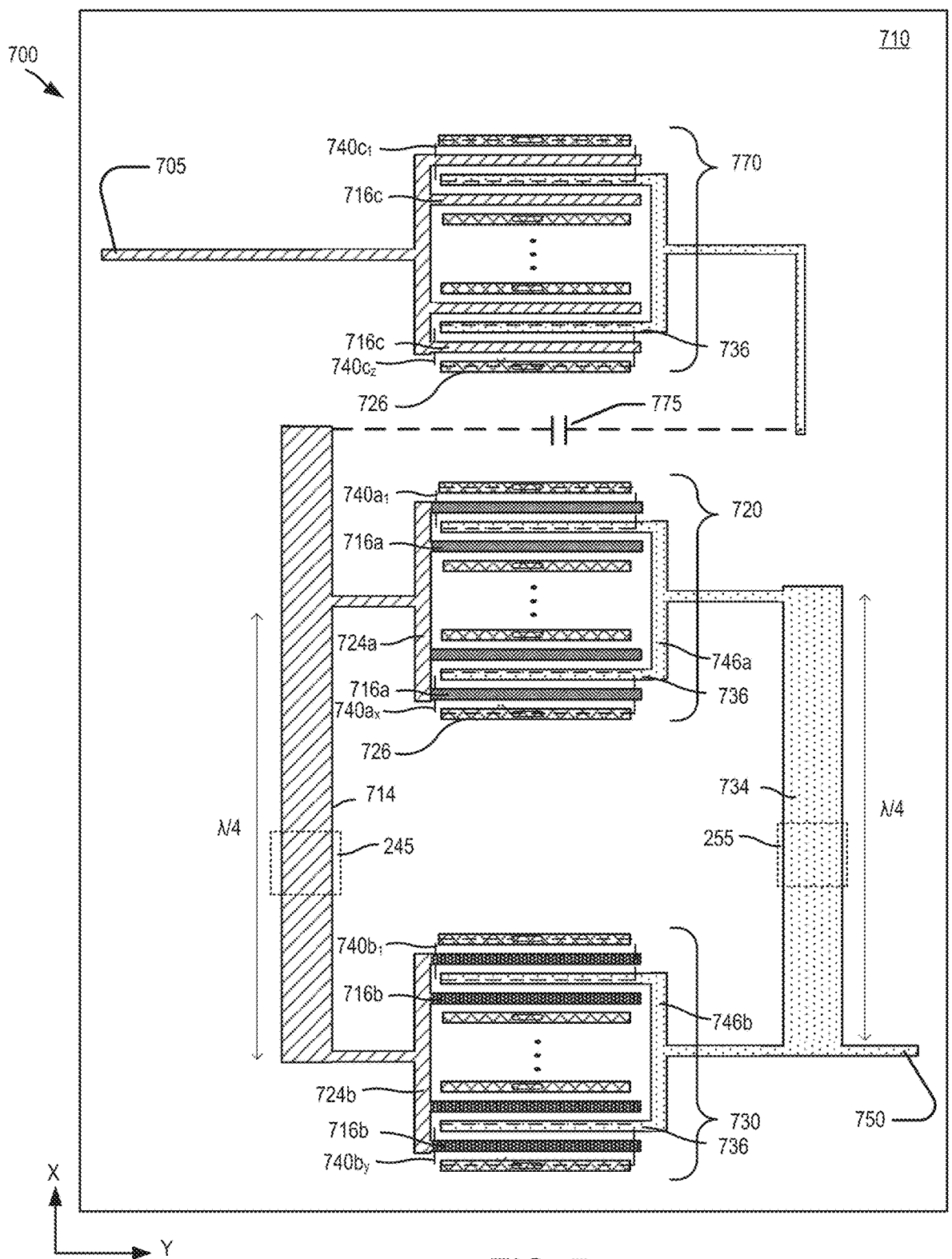
FIG. 7 illustrates a PA including an input driver on a same semiconductor die in accordance with some embodiments of the present disclosure.

Further embodiments described herein may utilize unit transistors with different characteristics to implement multistage PAs. For example, FIG. 7 illustrates a PA 700 in a Doherty configuration including a main amplifier 720 and a peaking amplifier 730 implemented using unit cell transistors having different operating, structural, and/or material characteristics on a same semiconductor die 710 in accordance with some embodiments described herein. The PA 700 of FIG. 7 is similar in some aspects to the PA 400 of FIG. 4, and further includes a driver amplifier 770 coupled between the input node 705 and gate runner 714 connecting the input(s) of the main and/or peaking amplifiers 720 and/or 730, similar to the optional driver 270 shown in the example of FIG. 2A. As further shown in FIG. 7, a DC blocking capacitor 775 is provided between the output of the driver amplifier 770 and the inputs to the main and peaking amplifiers 720 and 730, such that the drain bias of the driver amplifier 770 may not be directly connected to the gate of the main and peaking amplifiers 720 and 730. For example, the DC blocking capacitor 775 may be implemented by conductive finger elements with a dielectric layer therebetween and/or using different distributed element circuits as described herein. In some embodiments, the DC blocking capacitor 775 may be implemented by various types of on-wafer capacitors, such as a metal-insulator-metal (MIM) capacitors. The PA 700 thus includes first unit cell transistors $740a_1 \ldots 740a_x$ (including respective gate, source, and drain fingers $716a$, $726$, and $736$) having first (e.g., lower) threshold voltages $V_{TH-1}$ in a first group to define the main amplifier $720$, and second unit cell transistors $740b_1 \ldots 740b_y$ (including respective gate, source, and drain fingers $716b$, $726$, and $736$) having second (e.g., higher) threshold voltages $V_{TH-2}$ in a second group to define the peaking amplifier $730$ on a same semiconductor die $710$. The transistors $740c_1 \ldots 740c_z$ (including respective gate, source, and drain fingers $716c$, $726$, and $736$) of the driver amplifier $770$ on the semiconductor die $710$ may have third threshold voltages (e.g., $V_{TH-3}$) that are substantially similar to one another. The third threshold voltages $V_{TH-3}$ may be the same as or different from the first and/or second threshold voltages $V_{TH-1}$ and $V_{TH-2}$. Similar driver stages may be additionally or alternatively provided, for example, between the gate runner $714$ and the respective inputs to the gate buses $724a$ and $724b$.

Figure 8:
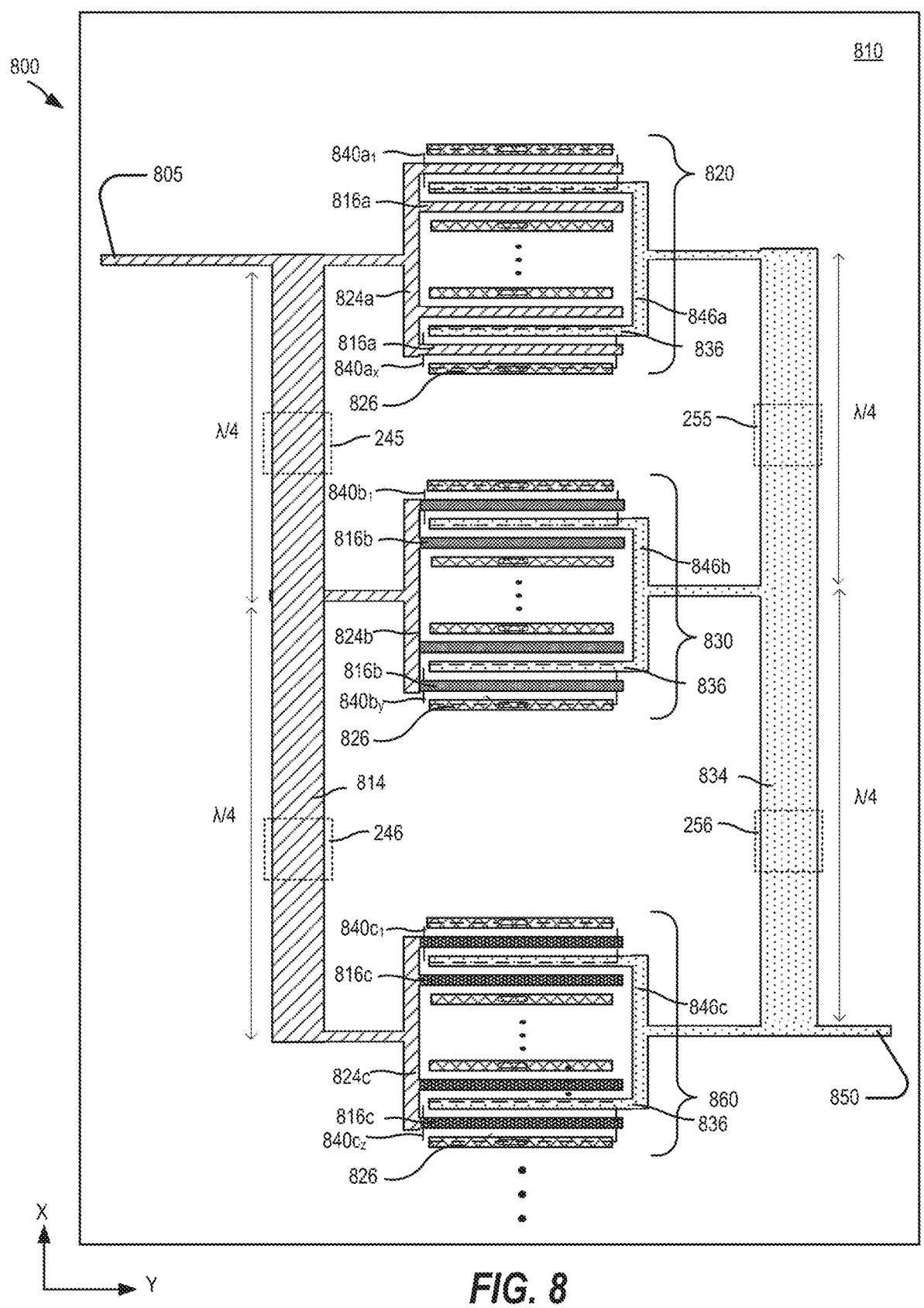
FIG. 8 illustrates a three-stage PA on a same semiconductor die in accordance with some embodiments of the present disclosure.

FIG. 8 illustrates a PA $800$ in a Doherty configuration including a main amplifier $820$ and a first peaking amplifier $830$ implemented using unit cell transistors having different operating, structural, and/or material characteristics on a same semiconductor die $810$ in accordance with some embodiments described herein. The PA $800$ of FIG. 8 is illustrated as a three-way Doherty arrangement that further includes second peaking amplifier $860$ having an input coupled to the gate runner $814$ and an output coupled to the drain runner $834$, to provide a three-stage configuration. The PA $800$ thus includes first unit cell transistors $840a_1 \ldots 840a_x$ (including respective gate, source, and drain fingers $816a$, $826$, and $836$) having first threshold voltages $V_{TH-1}$ in a first group to define the main amplifier $820$, second unit cell transistors $840b_1 \ldots 840b_y$ (including respective gate, source, and drain fingers $816b$, $826$, and $836$) having second threshold voltages $V_{TH-2}$ (e.g., higher than $V_{TH-1}$) in a second group to define the first peaking amplifier $830$, and third unit cell transistors $840c_1 \ldots 840c_z$ (including respective gate, source, and drain fingers $816c$, $826$, and $836$) having third threshold voltages $V_{TH-3}$ (e.g., higher than $V_{TH-2}$) in a third group to define the second peaking amplifier $860$.

The gate runner $814$ may act as a common biasing node or circuit for the transistors $840a$, $840b$, and $840c$ having the different threshold voltages $V_{TH-1}$, $V_{TH-2}$ and $V_{TH-3}$ on the same die $810$, and may define segments having respective electrical lengths (illustrated as $\lambda/4$) that are configured to introduce phase shifts between the respective signals provided to the inputs of the main amplifier $820$, the first peaking amplifier $830$, and the second peaking amplifier $860$, in to provide phase matching with the phase shifts to the respective output signals introduced by the electrical lengths of respective segments of the drain runner $834$ (also illustrated as $\lambda/4$) at the respective outputs of the main amplifier $820$ and the first peaking amplifier $830$. The segment of the drain runner $834$ between the output of the main amplifier $820$ and the output of the first peaking amplifier $830$ may be different (for example, in width) from the segment of the drain runner $834$ between the output of the first peaking amplifier $830$ and the output of the second peaking amplifier $860$. In some embodiments, this difference may be implemented using different distributed element circuits $255$ and $256$, respectively. Also, as discussed above with reference to the runners $414$, $434$ of FIG. 4, the respective runner segments $814$, $834$ may define the desired electrical lengths (e.g., one quarter wavelength) collectively/in combination with parasitic components for the non-compensated parasitics. That is, the respective runner segments $814$, $834$ may each provide some portion of the 90 degree phase shift, the remainder of which may be provided by the parasitic components. In further embodiments, for the non-phase inverting compensated parasitics, the respective segments of the runners $814$, $834$ may provide the full quarter wavelengths. For the phase inverting parasitic compensated devices, the power combining node $850$ may be provided at the top corner of the die $810$, e.g., at the output of the main amplifier $820$, and the input node $805$ may be provided at the bottom corner of the die $810$, e.g., at the input of the second peaking amplifier $860$). In still further embodiments, the (final) line connecting the power combining node $850$ to the output (e.g., a load matching circuit coupling the combining node $850$ to a load) may be designed or configured to transform the power combining node impedance to the output node impedance if the power combining node impedance is different from the output node impedance.

As such, in response to an RF input signal at input node $805$, operation of the transistors $840b$ of the first peaking amplifier $830$ modulates a load impedance at the output of the transistors $840a$ of the main amplifier $820$, and operation of the transistors $840c$ of the second peaking amplifier $860$ modulates a load impedance at the outputs of the transistors $840a$ and $840b$ of the main and first peaking amplifiers $820$ and $830$ based on a single gate bias. That is, all three of the main, first peaking, and second peaking amplifiers $820$, $830$, and $860$ are turned on at saturation; the main amplifier $820$ only is turned on to provide increased or maximum efficiency at a back-off point; and both main amplifier $820$ and first peaking amplifier $830$ are turned on (with second peaking amplifier $860$ being turned off) to provide intermediate efficiency.

The examples described herein are non-limiting, and other single-die, multi-stage amplifier arrangements implemented by transistors having two or more different threshold voltages to provide load modulation responsive to a common gate bias are included in the scope of the present disclosure. For example, while illustrated in FIG. 8 with reference to a three-way Doherty arrangement $800$, it will be understood that more than two peaking amplifiers $830$ and $860$ may be included in some embodiments, providing an N-way arrangement with N−1 peaking amplifiers (where N is an integer greater than 1). Also, multiple Doherty PAs $400$ or $800$ may be implemented in parallel on the same die $410$ or $810$ in some embodiments. Embodiments of the present disclosure may also be independent of transistor technology, such that any high-power RF transistor technologies may be used to implement on-die load modulation amplifier architectures as described herein. For example, the drain finger $336$ (e.g., the drain electrode), the source contact $326$, and the gate finger $316$ (e.g., the gate electrode) of the unit cell transistors $340$ of FIG. 3, may be respectively coupled to a drain region, a source region, and a channel region of a various embodiments of a semiconductor-based transistor unit cell. In some embodiments, the drain finger $336$, the source contact $326$, and the gate finger $316$ may be coupled to high electron mobility transistors (HEMT) and/or laterally diffused MOSFET (LDMOS) embodiments, though the present disclosure is not limited thereto.

Figure 9A:
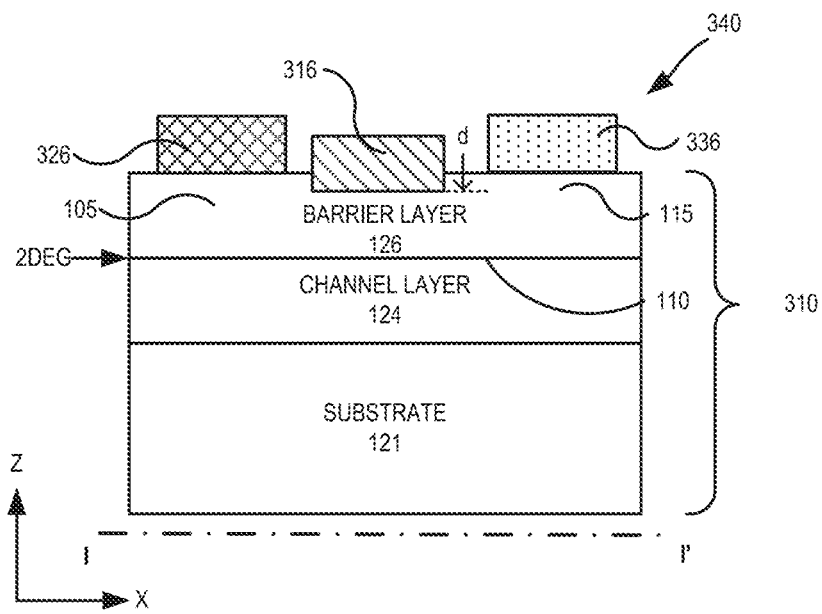
FIG. 9A is a cross section of a high-electron-mobility transistor (HEMT) cell that may be used as a unit cell transistor in accordance with some embodiments of the present disclosure.
Figure 9B:
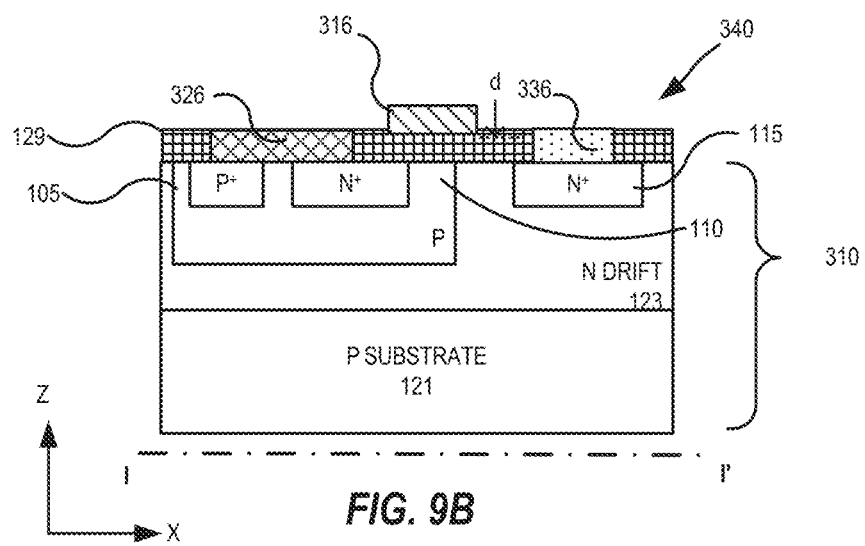
FIG. 9B is a cross section of a unit cell of a laterally diffused metal oxide semiconductor (LDMOS) transistor device that may be used as a unit cell transistor in accordance with some embodiments of the present disclosure.

In particular, some embodiments described herein can be implemented in the driver stage and/or the final stage of high power RF transistors where efficiency at back-off output power may be important or desired, e.g., for gallium nitride (GaN)-based technologies (such as HEMTs) as well as silicon-based technologies (such as LDMOS). FIGS. 9A and 9B illustrate example configurations of high electron mobility transistors ("HEMT") and LDMOS devices, respectively, that may be used as unit cell transistors (such as any of the unit cells 340, 440, 540, 740, 840) to implement single die, single bias load modulation amplifiers as described herein. The cross-sectional views shown in FIGS. 9A and 9B may be taken along line I-I' of one of the transistor unit cells 340 of FIG. 3.

FIG. 9A illustrates an implementation where the transistor unit cell 340 is a HEMT transistor cell. As shown in FIG. 9A, a HEMT transistor cell 340 may include a semiconductor die 310 including a substrate 121, which may, for example, include 4H—SiC or 6H—SiC. Although silicon carbide may be used as a substrate material, embodiments described herein may utilize any suitable substrate, such as sapphire, diamond, aluminum nitride, aluminum gallium nitride, gallium nitride, silicon, GaAs, LGO, ZnO, LAO, InP, and the like. An epitaxial structure is formed on the substrate 121. The epitaxial structure may include a channel layer 124 that is formed on the substrate 121, and a barrier layer 126 that is formed on the channel layer 124. The channel layer 124 and the barrier layer 126 may include Group III-nitride based materials, with the material of the barrier layer 126 having a higher bandgap than the material of the channel layer 124. For example, the channel layer 124 may comprise GaN, while the barrier layer 126 may comprise AlGaN. While the channel layer 124 and the barrier layer 126 are illustrated as single layer structures, it will be appreciated that either or both the channel layer 124 and/or the barrier layer 126 may be implemented as multi-layer structures. It will also be appreciated that additional layers such as, for example, buffer layers, strain-balancing layers, transition layers and the like may also be included as part of the epitaxial structure provided on the substrate 121.

Due to the difference in bandgap between the materials of barrier layer 126 and the channel layer 124 and piezoelectric effects at the interface between the barrier layer 126 and the channel layer 124 (e.g., channel region 110), a two dimensional electron gas (2DEG) is induced in the channel layer 124 at a junction between the channel layer 124 and the barrier layer 126. The 2DEG acts as a highly conductive layer that allows conduction between the source region 105 and drain region 115 of the device that are beneath a source contact segment 326 and a drain finger 336, respectively. The source contact segment 326 and the drain finger 336 are formed on the barrier layer 126. A gate finger 316 is formed on the barrier layer 126 between the drain finger 336 and the source contact segment 326.

FIG. 9B illustrates an implementation of the transistor cell 340 of FIG. 3 where the transistor cell is a metal-oxide-semiconductor field effect transistor (MOSFET) cell, in particular, an LDMOS. The LDMOS is a 3-terminal transistor device that has a source region 105, a channel region 110, and a drain region 115 that are formed in a semiconductor die 310. The semiconductor die 310 includes a substrate 121 (e.g., of p-type conductivity) and a drift layer 123 (e.g., of n-type conductivity) on the substrate 121. The substrate 121 may include semiconductor and non-semiconductor substrates, including, for example, sapphire, diamond, aluminum nitride, aluminum gallium nitride, gallium nitride, silicon, silicon carbide, GaAs, LGO, ZnO, LAO, InP, and the like. The LDMOS transistor cell 340 may include doped well regions providing the source region 105 and drain region 115. The source region 105, drain region 115, and channel region 110 of the LDMOS transistor cell 340 may be coupled to contacts for operation of the LDMOS transistor cell. For example, the channel region 110 may be electrically coupled to the gate fingers 316 (e.g., as a gate electrode), drain region 115 may be electrically coupled to the drain fingers 336 (e.g., as a drain electrode), and source region 105 may be electrically coupled to source contacts 326.

The channel region 110 is isolated from the conducting channel (e.g., the gate finger 316) by an insulator layer 129 (e.g., $SiO_2$). Applying a positive voltage to the channel region 110 with respect to the source region 105 may provide for a current to flow between drain region 115 and the source region 105 by forming an inversion layer (e.g., a channel) between the source region 105 and the drain region 115. LDMOS FETs may operate in "enhancement mode," meaning the drain-source current may not flow until an applied positive gate voltage enhances a channel between the drain region 115 and the source region 105.

Though FIGS. 9A and 9B illustrate transistor structures with a contact 326 connected to an upper surface of the source region 105, it will be understood that other embodiments are possible. For example, in some embodiments, vias or other connection regions may be provided to connect the source region 105 to a contact on the bottom surface of the device 340. The HEMT and LDMOS devices of FIGS. 9A and 9B are included as examples for possible configurations of a transistor unit cell, but it will be understood that other transistor cell configurations could be utilized with the present invention without deviating from the scope of the embodiments of the present disclosure. For example, any configuration of a transistor unit cell that may be combined with other transistor cells having different threshold voltages and/or other operating characteristics on a same semiconductor die may benefit from the embodiments of the present disclosure. As such, the present invention is not limited to HEMT and LDMOS transistor cells.

The different threshold voltages for the transistors of the main and peaking amplifiers described herein may be achieved by various techniques, but embodiments described herein are not limited to any particular technique. For example, the threshold voltage may be varied in transistors formed in different regions of the same semiconductor die by using different materials (e.g., different metals or metal alloys), different shapes (e.g., gate finger shapes in plan view and/or cross-section), different structures (e.g., differing thicknesses or depths), and/or different doping concentrations to form the gate fingers 316 (and/or different portions of the same gate finger) of the main and peaking amplifiers. Additionally or alternatively, the different threshold voltages may be implemented by and/or altering the composition, doping concentration and/or thickness of one or more layers 126, 123 between the gate fingers and the underlying channel regions 110 of the main and peaking amplifiers.

For example, in HEMT devices as shown in FIG. 9A, the barrier layers 126 under the gate fingers 316 of the unit cell transistors 340 for the main amplifier may have different material compositions and/or thicknesses than the barrier layers 126 of the unit cell transistors 340 for the peaking amplifier. For instance, the barrier layer 126 may comprise an $Al_nGa_{1-n}N$ layer, where the value of "n" may be different in the unit cell transistors 340 of the main amplifier versus the peaking amplifier in order to provide the different threshold voltage values. Additionally or alternatively, the barrier layer 126 may have a different thickness in the z-direction in the unit cell transistors 340 of the main amplifier versus the peaking amplifier. For example, the barrier layers 126 may include recesses d of different depths in the unit cell transistors 340 of the main amplifier and the peaking amplifier. Because of the differing depths of the recess d in the barrier layer 126, a height of the bottom surface of the gate finger 316a may be closer to the channel layer 110 than is a bottom surface of the gate finger 316b. As a result, the threshold voltage value $V_{TH-1}$ for the gate finger 316a may be less than the threshold voltage value $V_{TH-2}$ for the gate finger 316b. In other embodiments, the doping concentration of the barrier layer 126 and/or the channel layer 124 may be varied in different regions of the die to vary the threshold voltage.

In another example, in LDMOS devices as shown in FIG. 9B, portions of the channel layer 110 may be doped to change the threshold voltage under different gate fingers 316 and/or different portions of the gate fingers 316. For example, respective channel layers 110 that are under the different gate fingers 316 may have different dopant concentrations in the unit cell transistors 340 of the main amplifier versus the peaking amplifier. The doping concentrations may be selected to achieve a desired variation in the threshold voltages in the unit cell transistors 340 of the main amplifier versus the peaking amplifier.

It will be understood that the different threshold voltages and/or other characteristics described herein refer to measurable differences that exceed production tolerances for the respective fingers, runners, and/or other elements described herein. In particular, the variance in the different threshold voltages of the transistors may be outside of the range of acceptable variances among transistors having similar characteristics or other circuit structures as described herein. For example, as shown in FIG. 11, there may be some variation in the threshold voltage across a semiconductor wafer 1100 due to variations in semiconductor growth and processing techniques. A typical variation may be in the range of 0.1 to 0.4 volts. However, given the large number of multi-cell semiconductor dies 1110 formed on the wafer 1100, the variation in threshold voltage due to processing variations within the footprint of any particular semiconductor die 1110 may be much smaller, such as in the range of 0.0001 to 0.0004 volts. Such small variations do essentially nothing to spread out the device turn-on. As discussed above, pursuant to embodiments of the present disclosure, larger variations in the threshold voltage values may be deliberately engineered into the device design, such as variations on the order of 0.05 to 1.0 volts, or 0.05 to 3 volts or more. Such variations may be used to spread out the threshold voltages over which different amplifiers on a same semiconductor die 1110 turn on, thereby allowing for the fabrication of single die, single bias load modulation amplifiers as described herein.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present invention. As used herein, the term "and/or" includes any and all combinations of one or more of the associated listed items.

The terminology used herein is for the purpose of describing particular embodiments only and is not intended to be limiting of the invention. As used herein, the singular forms "a," "an" and "the" are intended to include the plural forms as well, unless the context clearly indicates otherwise. It will be further understood that the terms "comprises" "comprising," "includes" and/or "including" when used herein, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms used herein should be interpreted as having a meaning that is consistent with their meaning in the context of this specification and the relevant art and will not be interpreted in an idealized or overly formal sense unless expressly so defined herein.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "lateral" or "vertical" may be used herein to describe a relationship of one element, layer or region to another element, layer or region as illustrated in the figures. It will be understood that these terms are intended to encompass different orientations of the device in addition to the orientation depicted in the figures.

Embodiments of the invention are described herein with reference to cross-section illustrations that are schematic illustrations of idealized embodiments (and intermediate structures) of the invention. The thickness of layers and regions in the drawings may be exaggerated for clarity. Additionally, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing. Elements illustrated by dotted lines may be optional in the embodiments illustrated.

Like numbers refer to like elements throughout. Thus, the same or similar numbers may be described with reference to other drawings even if they are neither mentioned nor described in the corresponding drawing. Also, elements that are not denoted by reference numbers may be described with reference to other drawings.

In the drawings and specification, there have been disclosed typical embodiments of the invention and, although specific terms are employed, they are used in a generic and descriptive sense only and not for purposes of limitation, the scope of the invention being set forth in the following claims.

The invention claimed is:
1. A power amplifier, comprising:
a semiconductor die comprising a main amplifier including a first transistor, and a peaking amplifier including a second transistor having at least one characteristic different than the first transistor,
wherein the peaking amplifier is configured to modulate a load impedance of the main amplifier responsive to a common gate bias applied to respective gates of the first and second transistors,
wherein the semiconductor die further comprises a transmission line that electrically connects respective inputs or respective outputs of the main amplifier and the peaking amplifier,
wherein the transmission line comprises a conductive segment extending on the semiconductor die, and a length of the conductive segment extending on the semiconductor die is configured to provide signals to the respective inputs or signals from the respective outputs with a predetermined phase shift therebetween based on a frequency component of an input signal.

2. A power amplifier, comprising:
a semiconductor die comprising a main amplifier including a first transistor, and a peaking amplifier including a second transistor having at least one characteristic different than the first transistor,
wherein the peaking amplifier is configured to modulate a load impedance of the main amplifier responsive to a common gate bias applied to respective gates of the first and second transistors,
wherein the semiconductor die further comprises an input transmission line that electrically connects respective inputs of the main and the peaking amplifiers on the semiconductor die to provide an input signal thereto, and an output transmission line that electrically connects respective outputs of the main and the peaking amplifiers on the semiconductor die,
wherein the respective gates of the first and second transistors comprise respective elongated gate fingers, and wherein the input transmission line comprises a gate runner that electrically connects the respective elongated gate fingers of the first and second transistors to provide the common gate bias thereto, and
wherein at least one of the input transmission line or the output transmission line comprises an electrical length that is configured to provide signals to the respective inputs or signals from the respective outputs, respectively, with a predetermined phase shift therebetween based on a frequency component of the input signal.

3. The power amplifier of claim 2, wherein the first and second transistors further comprise respective elongated drain contacts extending between pairs of the respective elongated gate fingers, and wherein the output transmission line comprises a drain runner that electrically connects the respective elongated drain contacts of the first and second transistors.

4. The power amplifier of claim 3, wherein:
the electrical length of the input transmission line is defined by a portion of the gate runner that extends between the respective elongated gate fingers of the first and second transistors; and/or
the electrical length of the output transmission line is defined by a portion of the drain runner that extends between the respective elongated drain contacts of the first and second transistors.

5. The power amplifier of claim 4, wherein the portion of the gate runner and/or or the portion of the drain runner is free of electrical connections to the first and second transistors.

6. The power amplifier of claim 4, wherein the respective elongated gate fingers of the first and second transistors are connected to the gate runner by first and second gate buses at opposite ends of the portion of the gate runner, respectively, and the respective elongated drain contacts of the first and second transistors are connected to the drain runner by first and second drain buses at opposite ends of the portion of the drain runner, respectively.

7. The power amplifier of claim 2, wherein the respective elongated gate fingers of the first transistors comprise different materials, different dopant concentrations, different thicknesses, and/or different depths relative to respective channel regions thereof than the respective elongated gate fingers of the second transistors on the semiconductor die.

8. The power amplifier of claim 1, wherein the length comprises one quarter of a wavelength corresponding to a frequency component of the input signal.

9. The power amplifier of claim 2 wherein at least one of the input transmission line or the output transmission line comprises a distributed element circuit on the semiconductor die and is free of lumped elements.

10. A power amplifier, comprising:
a semiconductor die comprising a main amplifier including a first transistor having a first threshold voltage, and a peaking amplifier including a second transistor having a second threshold voltage that is different than the first threshold voltage,
wherein the peaking amplifier is configured to modulate a load impedance of the main amplifier responsive to a common gate bias applied to respective gates of the first and second transistors,
wherein, based on the common gate bias, the first and second transistors on the semiconductor die are configured to turn on in sequence responsive to different power levels of an input signal to the power amplifier, and
wherein the semiconductor die further comprises a third amplifier including a third transistor having a third threshold voltage that is different than the first and second threshold voltages.

11. The power amplifier of claim 10, wherein the third amplifier comprises a driver amplifier having an input configured to receive the input signal to the power amplifier and an output coupled to one or more of the respective gates of the first or second transistors.

12. A method of fabricating a power amplifier, the method comprising:
forming a semiconductor die comprising a main amplifier including a first transistor and a peaking amplifier including a second transistor having at least one characteristic different than the first transistor,
wherein the peaking amplifier is configured to modulate a load impedance of the main amplifier responsive to a common gate bias applied to respective gates of the first and second transistors of the semiconductor die,
wherein the semiconductor die further comprises a transmission line that electrically connects respective inputs or respective outputs of the main amplifier and the peaking amplifier,
wherein the transmission line comprises a conductive segment extending on the semiconductor die, and a length of the conductive segment extending on the semiconductor die is configured to provide signals to the respective inputs or signals from the respective outputs with a predetermined phase shift therebetween based on a frequency component of an input signal.

13. A semiconductor device, comprising:
a semiconductor die;
a first amplifier on the semiconductor die, the first amplifier comprising a plurality of first transistors having a first threshold voltage and comprising first gate fingers;
a second amplifier on the semiconductor die, the second amplifier comprising a plurality of second transistors having a second threshold voltage different than the first threshold voltage and comprising second gate fingers; and a gate runner on the semiconductor die, the gate runner electrically connecting the first gate fingers and the second gate fingers to apply a common gate bias to the first and second amplifiers, wherein a portion of the gate runner extending between the first gate fingers and the second gate fingers comprises an electrical length that is based on a frequency component of a radio frequency (RF) input signal to the first and second amplifiers.

14. The semiconductor device of claim 13, wherein, based on the common gate bias, the first and second amplifiers are configured to turn on in sequence responsive to different power levels of the RF input signal.

15. The semiconductor device of claim 13, further comprising:

a drain runner on the semiconductor die, the drain runner electrically connecting first drain fingers of the first transistors and second drain fingers of the second transistors, wherein a portion of the drain runner extending between the first drain fingers and the second drain fingers comprises the electrical length.

16. The semiconductor device of claim 15, wherein the portion of the gate runner and/or or the portion of the drain runner is free of electrical connections to the first and second transistors.

17. The semiconductor device of claim 15, wherein the first and second gate fingers are connected to the gate runner by first and second gate buses at opposite ends of the portion of the gate runner, respectively, and the first and second drain fingers are connected to the drain runner by first and second drain buses at opposite ends of the portion of the drain runner, respectively.

18. The semiconductor device of claim 15, wherein the electrical length comprises one quarter of a wavelength corresponding to the frequency component of the RF input signal.

19. The semiconductor device of claim 15, wherein at least one of the gate runner or the drain runner comprises a distributed element circuit on the semiconductor die and is free of lumped elements.

20. The semiconductor device of claim 13, wherein the first gate fingers of the first transistors comprise different materials, different dopant concentrations, different thicknesses, and/or different depths relative to respective channel regions thereof than the second gate fingers of the second transistors on the semiconductor die.

21. The semiconductor device of claim 13, wherein the semiconductor die further comprises a third amplifier including a plurality of third transistors having a third threshold voltage that is different from the first and second threshold voltages.

22. The semiconductor device of claim 21, wherein the third amplifier comprises a driver amplifier having an input configured to receive the RF input signal and an output coupled to one or more of the first or second gate fingers.

23. The semiconductor device of claim 13, wherein the plurality of the second transistors is greater in number than the plurality of the first transistors.

24. The semiconductor device of claim 13, wherein the plurality of the first and second transistors comprise high electron mobility transistors (HEMTs) or metal-oxide-semiconductor field effect transistors (MOSFETs).

25. The method of claim 12, wherein, based on the common gate bias, the first and second transistors on the semiconductor die are configured to turn on in sequence responsive to different power levels of the input signal to the power amplifier.

26. The method of claim 25, wherein the first and second transistors have different first and second threshold voltages, respectively.

27. The method of claim 12, wherein the transmission line is an input transmission line that electrically connects respective inputs of the main and the peaking amplifiers on the semiconductor die to provide the input signal thereto.

28. The method of claim 27, wherein the transmission line is an output transmission line that electrically connects respective outputs of the main and the peaking amplifiers on the semiconductor die.

29. The method of claim 28, wherein the respective gates of the first and second transistors comprise respective elongated gate fingers, and wherein the input transmission line comprises a gate runner that electrically connects the respective elongated gate fingers of the first and second transistors to provide the common gate bias thereto.

30. The method of claim 29, wherein the first and second transistors further comprise respective elongated drain contacts extending between pairs of the respective elongated gate fingers, and wherein the output transmission line comprises a drain runner that electrically connects the respective elongated drain contacts of the first and second transistors.

31. The method of claim 26, wherein forming the semiconductor die comprises forming the respective gates of the first transistors with different materials, different dopant concentrations, different thicknesses, and/or different depths relative to respective channel regions thereof than the respective gates of the second transistors on the semiconductor die.

32. The method of claim 12, wherein forming the semiconductor die comprises singulating the semiconductor die comprising the main amplifier and the peaking amplifier thereon from a semiconductor wafer.

* * * * *

UNITED STATES PATENT AND TRADEMARK OFFICE
CERTIFICATE OF CORRECTION

PATENT NO. : 12,009,788 B2
APPLICATION NO. : 16/367631
DATED : June 11, 2024
INVENTOR(S) : Mokhti et al.

It is certified that error appears in the above-identified patent and that said Letters Patent is hereby corrected as shown below:

In the Claims

Column 21, Line 59, Claim 5: Please correct "and/or or the" to read --and/or the--

Column 23, Line 28, Claim 16: Please correct "and/or or the" to read --and/or the--

Signed and Sealed this
Nineteenth Day of November, 2024

Katherine Kelly Vidal
*Director of the United States Patent and Trademark Office*